(12) United States Patent
Iwahashi

(10) Patent No.: US 10,748,826 B2
(45) Date of Patent: Aug. 18, 2020

(54) POWER MODULE AND INVERTER EQUIPMENT

(71) Applicant: ROHM CO., LTD., Kyoto-shi, Kyoto (JP)

(72) Inventor: Seita Iwahashi, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/390,945

(22) Filed: Apr. 22, 2019

(65) Prior Publication Data
US 2019/0252279 A1 Aug. 15, 2019

Related U.S. Application Data

(63) Continuation of application No. 15/863,537, filed on Jan. 5, 2018, now abandoned, which is a continuation
(Continued)

(30) Foreign Application Priority Data

Jul. 6, 2015 (JP) .................. 2015-135329

(51) Int. Cl.
*H01L 21/00* (2006.01)
*H01L 23/31* (2006.01)
(Continued)

(52) U.S. Cl.
CPC .......... *H01L 23/3107* (2013.01); *H01L 23/12* (2013.01); *H01L 23/18* (2013.01);
(Continued)

(58) Field of Classification Search
CPC ......... H01L 23/12; H01L 23/18; H01L 23/29; H01L 23/36; H01L 23/367;
(Continued)

(56) References Cited

U.S. PATENT DOCUMENTS

| 4,812,420 A | 3/1989 | Matsuda et al. |
| 6,657,293 B1 * | 12/2003 | Fumihira .......... H01L 23/49827 257/690 |
| 10,242,964 B1 * | 3/2019 | Lin ................... H01L 23/49506 |
| 2006/0138532 A1 | 6/2006 | Okamoto et al. |
| 2008/0230890 A1 | 9/2008 | Ueda |

(Continued)

FOREIGN PATENT DOCUMENTS

| EP | 2838327 A1 | 2/2015 |
| JP | H02-130866 A | 5/1990 |

(Continued)

OTHER PUBLICATIONS

Extended European Search Report, European Application No. 16821241.3, dated Jun. 21, 2018 (9 pages).

*Primary Examiner* — Richard A Booth
(74) *Attorney, Agent, or Firm* — Hamre, Schumann, Mueller & Larson, P.C.

(57) ABSTRACT

The power module includes: a first metallic pattern; a plurality of power devices bonded on the first metallic pattern, each of the plurality of the power devices has a thickness thinner than a thickness of the metallic pattern; a frame member disposed so as to collectively enclose a predetermined number of the power devices on the first metallic pattern; a second metallic pattern disposed outside the frame member; and a resin layer configured to seal the plurality of the power devices and the first and second metallic patterns so as to include the frame member, wherein the frame member suppresses a stress according to a difference between a coefficient of thermal expansion of the metallic pattern and a coefficient of thermal expansion of the power devices. There is provided the power module easy to be fabricated, capable of suppressing the degradation of the bonded portion and improving reliability.

24 Claims, 33 Drawing Sheets

Related U.S. Application Data of application No. PCT/JP2016/068675, filed on Jun. 23, 2016.

(51) Int. Cl.

| | | |
|---|---|---|
| *H01L 23/12* | (2006.01) | |
| *H01L 23/29* | (2006.01) | |
| *H01L 23/36* | (2006.01) | |
| *H01L 25/07* | (2006.01) | |
| *H01L 25/18* | (2006.01) | |
| *H01L 23/18* | (2006.01) | |
| *H01L 23/367* | (2006.01) | |
| *H01L 23/498* | (2006.01) | |
| *H02M 7/00* | (2006.01) | |
| *H02M 7/537* | (2006.01) | |
| *H02P 27/06* | (2006.01) | |

(52) U.S. Cl.
CPC ............. *H01L 23/29* (2013.01); *H01L 23/36* (2013.01); *H01L 23/367* (2013.01); *H01L 23/49838* (2013.01); *H01L 25/07* (2013.01); *H01L 25/072* (2013.01); *H01L 25/18* (2013.01); *H02M 7/003* (2013.01); *H02M 7/537* (2013.01); *H01L 2224/73265* (2013.01); *H01L 2224/8592* (2013.01); *H02P 27/06* (2013.01)

(58) Field of Classification Search
CPC . H01L 23/49838; H01L 25/07; H01L 25/072; H01L 25/18; H02M 7/003; H02M 7/537
See application file for complete search history.

(56) References Cited

U.S. PATENT DOCUMENTS

| | | |
|---|---|---|
| 2010/0327421 A1 | 12/2010 | Luan |
| 2011/0204497 A1 | 8/2011 | Matsuda et al. |
| 2014/0239470 A1 | 8/2014 | Yahata et al. |
| 2015/0076517 A1 | 3/2015 | Terai et al. |
| 2016/0163618 A1 | 6/2016 | Tani et al. |
| 2020/0168560 A1* | 5/2020 | Tsai ................... H01L 23/3107 |

FOREIGN PATENT DOCUMENTS

| | | |
|---|---|---|
| JP | 8-222658 A | 8/1996 |
| JP | 2004-327732 A | 11/2004 |
| JP | 2008-263184 A | 10/2008 |
| JP | 2009-200088 A | 9/2009 |
| JP | 2012-231101 A | 11/2012 |
| JP | 2013-172044 A | 9/2013 |
| JP | 2014-53403 A | 3/2014 |
| JP | 2014-53441 A | 3/2014 |
| JP | 2014-216459 A | 11/2014 |
| WO | 2015/022994 A1 | 2/2015 |

\* cited by examiner

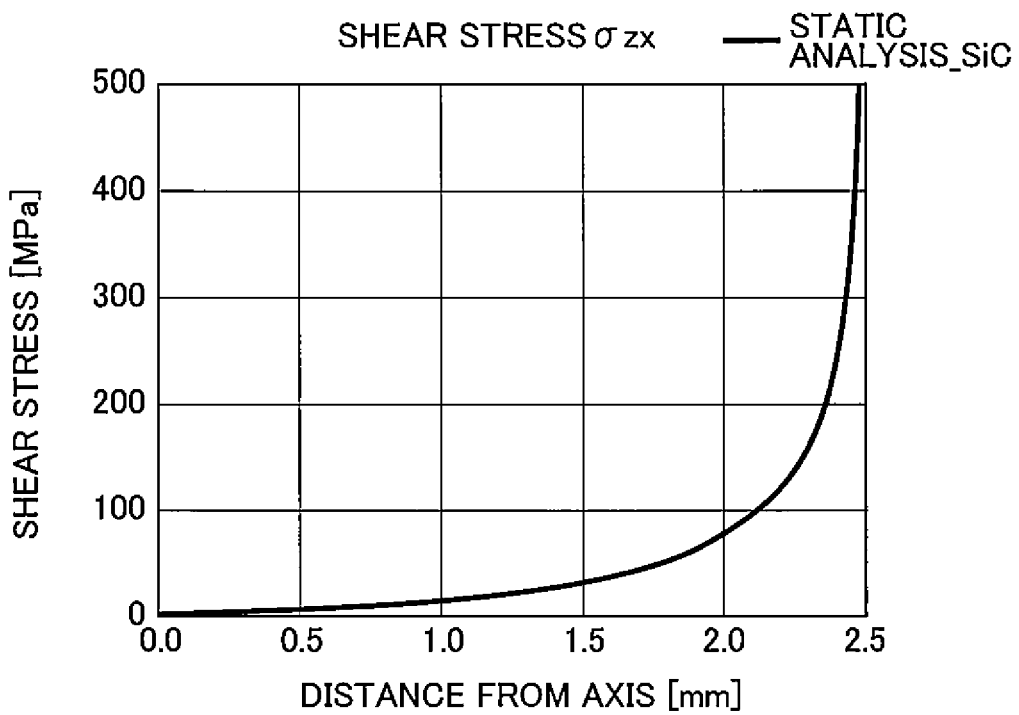
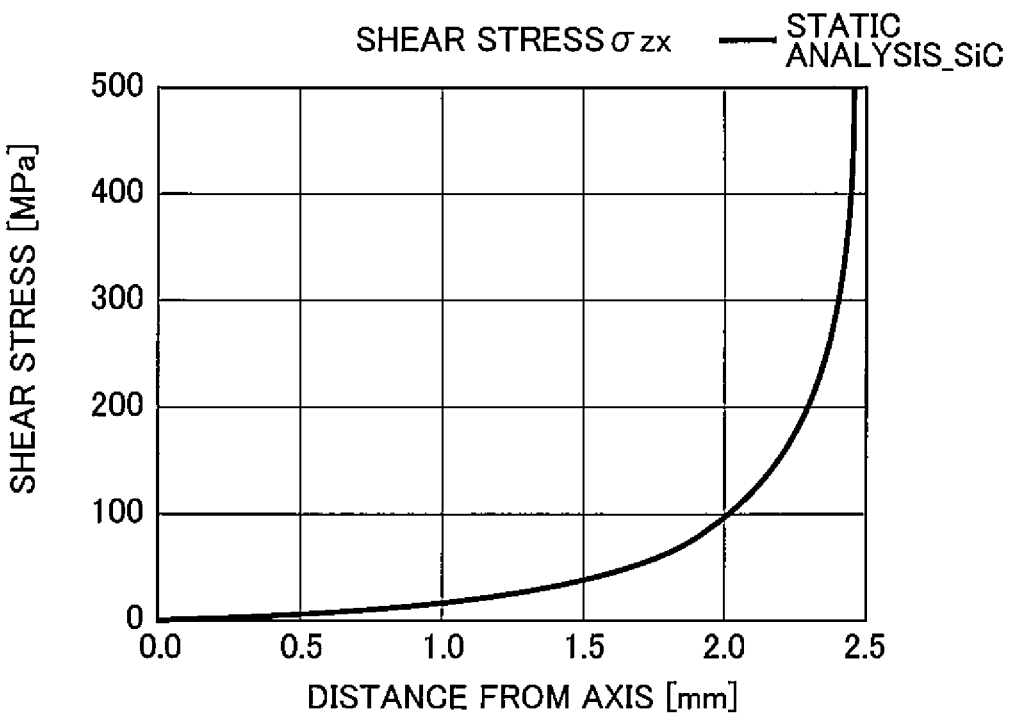

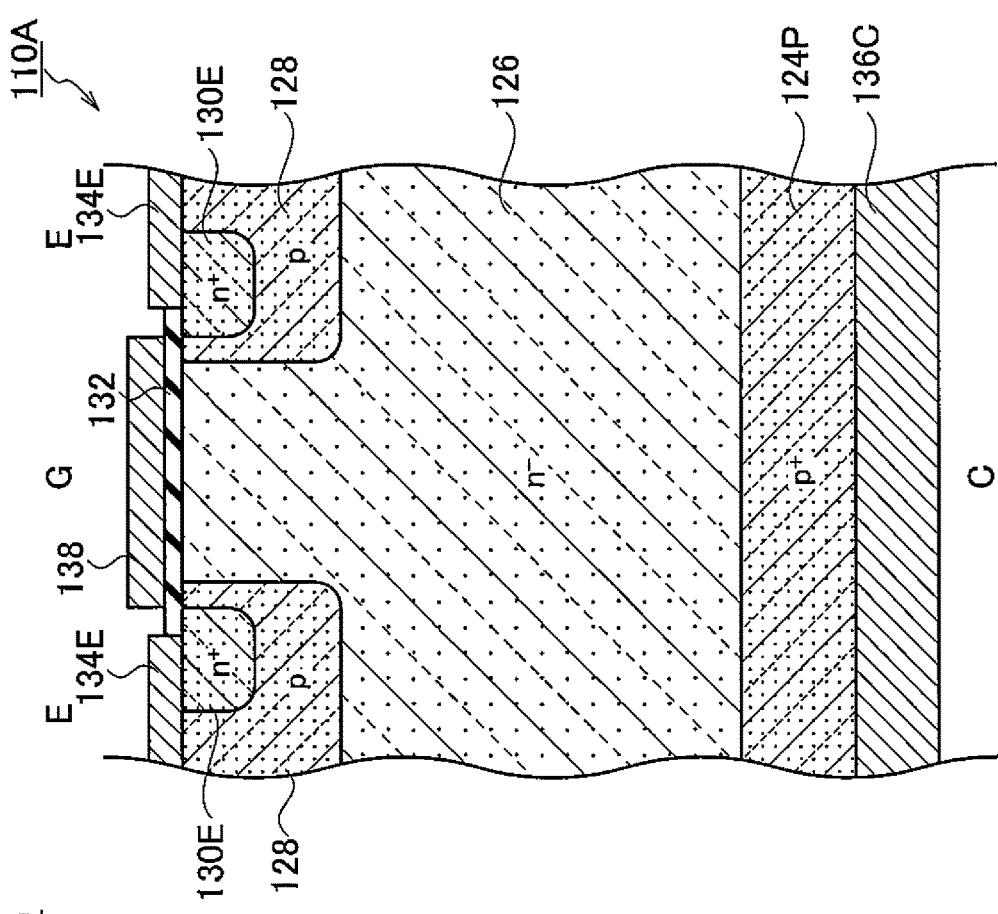
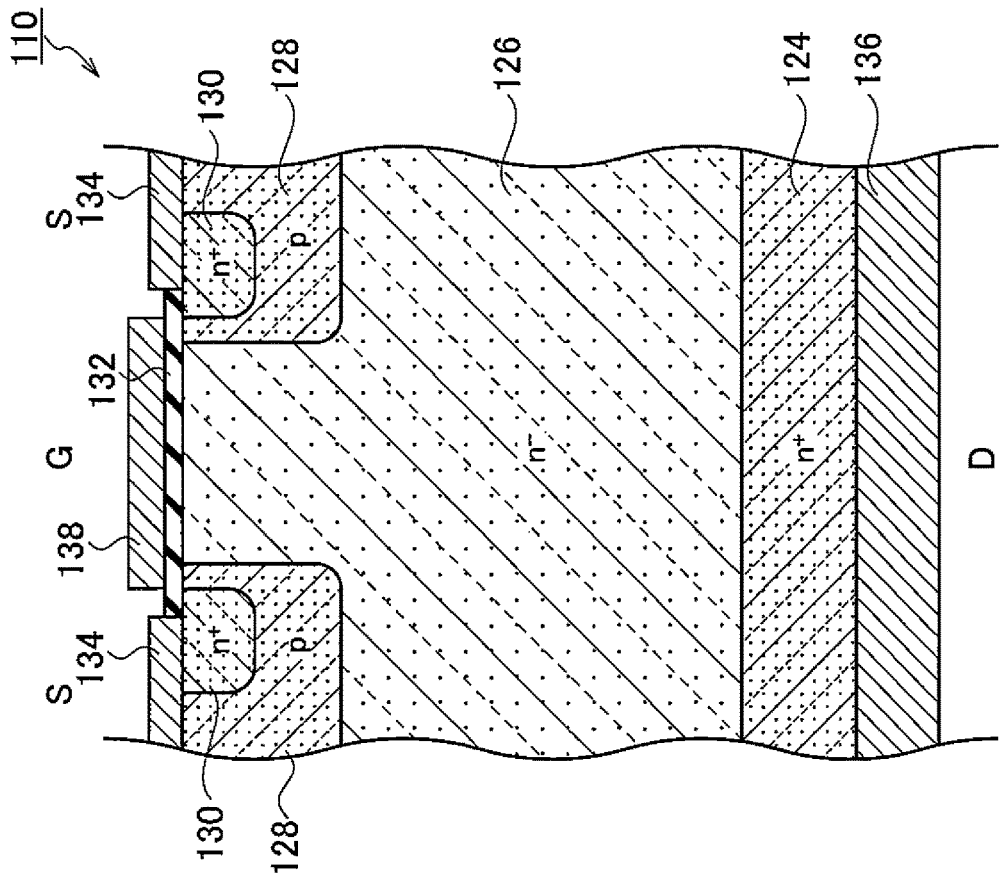

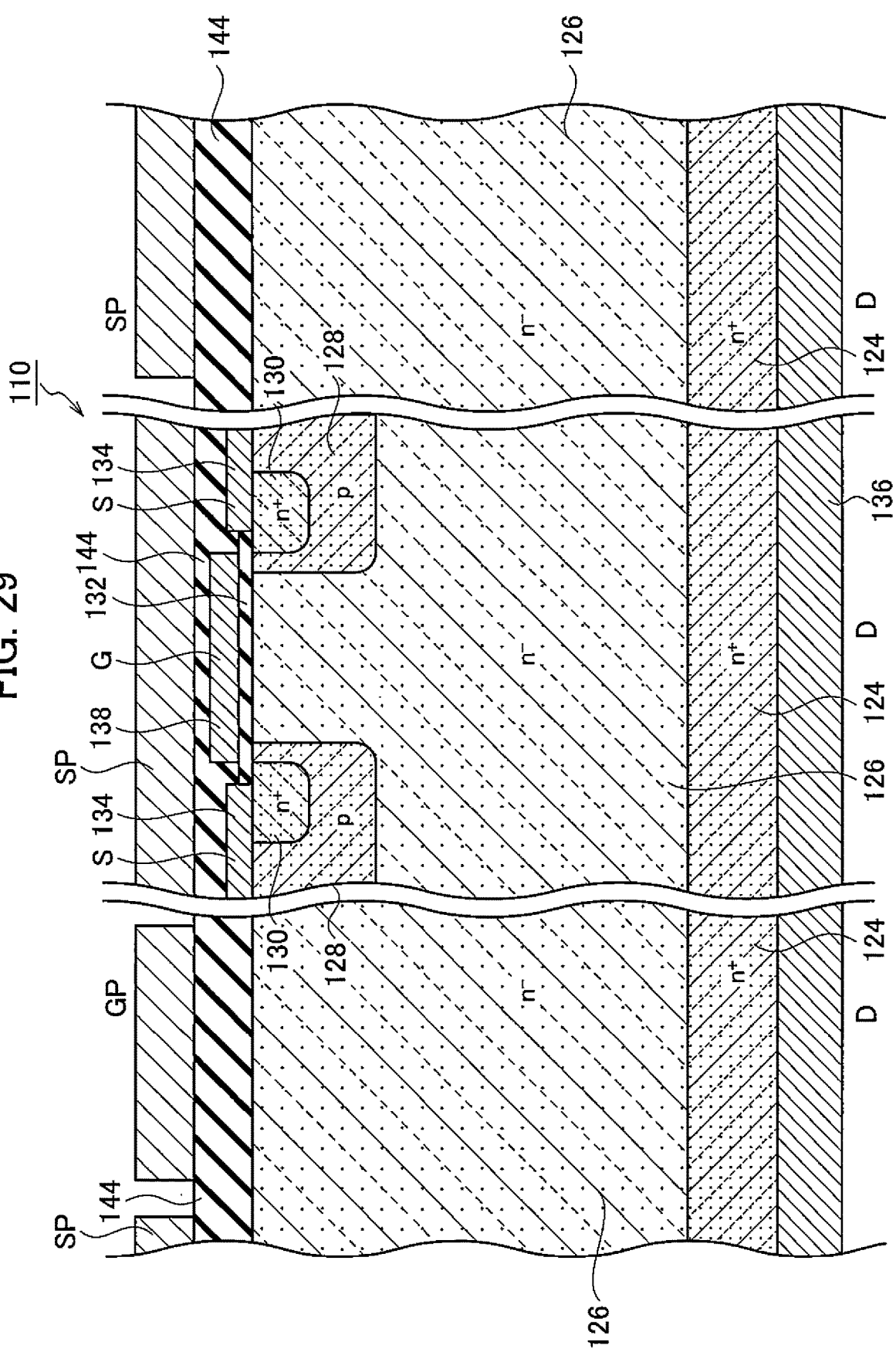

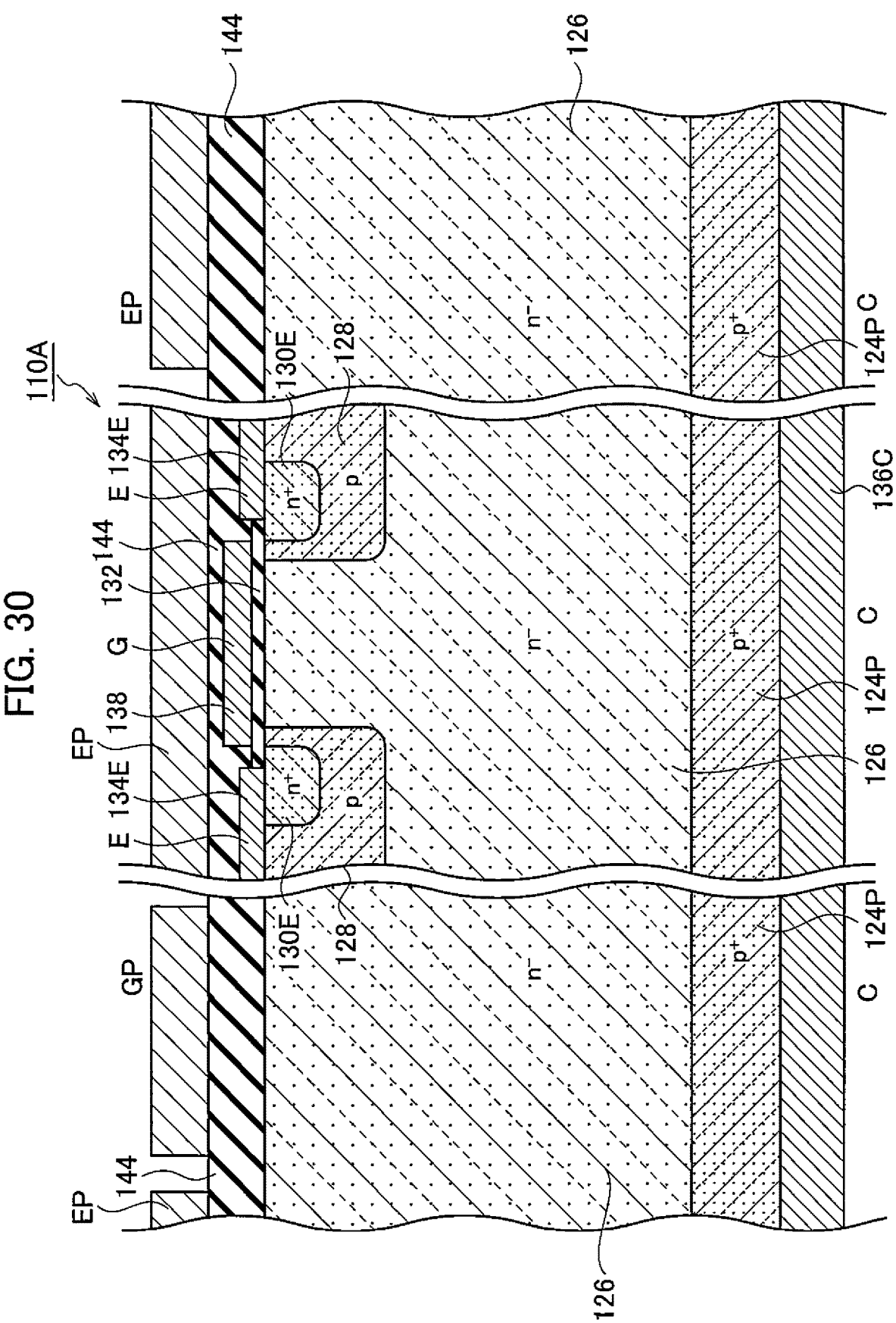

POWER MODULE AND INVERTER EQUIPMENT

CROSS REFERENCE TO RELATED APPLICATIONS

This is a continuation application (CA) of PCT Application No. PCT/JP2016/068675, filed on Jun. 23, 2016, which claims priority to Japan Patent Application No. P2015-135329 filed on Jul. 6, 2015 and is based upon and claims the benefit of priority from prior Japanese Patent Applications No. P2015-135329 filed on Jul. 6, 2015 and PCT Application No. PCT/JP2016/068675, filed on Jun. 23, 2016, the entire contents of each of which are incorporated herein by reference.

FIELD

Embodiments described herein relate to a power module, and inverter equipment on which such a power module is mounted.

BACKGROUND

Many research institutions are currently conducting research to develop Silicon Carbide (SiC) devices. SiC power devices have low on resistance as compared with Si power devices, and also include high switching speed and high temperature operation characteristics.

Since losses (on resistance) produced by SiC devices are relatively low, a large electric current can be conducted even in SiC power modules having small area and therefore such SiC power modules can be miniaturized.

It is well known that case type packages are adopted into such SiC power devices, and resin sealed semiconductor devices are formed by transfer molding.

In the light of miniaturization of conventional power modules, thin type power modules have been required therefor, and Direct Bonding Copper (DBC) substrates, Direct Brazed Aluminum (DBA) substrates, or Active Metal Brazed, Active Metal Bond (AMB) substrates have been used in mounting processes.

SUMMARY

However, there is a problem that degradation (such as a rupture) of a bonded portion occurs during a heat cycle test, when semiconductor devices (e.g. SiC power devices) are bonded on metallic substrates (e.g. DBC substrates), if a difference between the both values of coefficient of thermal expansion (CTE) is relatively large.

The embodiments provide: a power module easy to be fabricated, capable of suppressing such a degradation of the bonded portion and improving reliability; and the inverter equipment on which such a power module is mounted.

According to one aspect of the embodiments, there is provided a power module comprising: a first metallic pattern; a plurality of power devices configured to be bonded on the first metallic pattern, each of the plurality of the power devices has a thickness thinner than a thickness of the metallic pattern; a frame member disposed so as to collectively enclose a predetermined number of the plurality of the power devices on the first metallic pattern; a second metallic pattern disposed outside the frame member; and a resin layer configured to seal the plurality of the power devices, the first metallic pattern, and the second metallic pattern so as to include the frame member, wherein the frame member suppresses a stress according to a difference between a coefficient of thermal expansion of the metallic pattern and a coefficient of thermal expansion of the power devices.

According to another aspect of the embodiments, there is provided inverter equipment comprising a circuit in which a plurality of switching elements are connected in series between power terminals and a connection unit of the plurality of the switching elements is used as an output, wherein the inverter equipment is configured to mount at least one power module which is mentioned above as the switching elements.

According to the embodiments, there can be provided: the power module easy to be fabricated, capable of suppressing the degradation of the bonded portion and improving reliability; and the inverter equipment on which such a power module is mounted.

BRIEF DESCRIPTION OF DRAWINGS

FIG. 10A shows a simulation result showing a relationship between a shear stress and a distance from an axis of the power module with a ceramic frame, in an example of a case where a resin layer is formed thereon.

FIG. 10B shows a simulation result showing a relationship between a shear stress and a distance from an axis of the power module without a ceramic frame, in an example of a case where a resin layer is formed thereon.

FIG. 253 is a circuit representative diagram of an Insulated Gate Bipolar Transistor (IGBT) of a 1-in-1 module, in the power module according to the embodiments.

FIG. 28A is a schematic cross-sectional structure diagram of an SiC MISFET, which is an example of a semiconductor device to be applied to the power module according to the embodiments.

FIG. 28B is a schematic cross-sectional structure diagram of an IGBT, which is an example of the semiconductor device to be applied to the power module according to the embodiments.

FIG. 29 is a schematic cross-sectional structure diagram showing an SiC MISFET including a source pad electrode SP and a gate pad electrode GP, which is an example of the semiconductor device to be applied to the power module according to the embodiments.

FIG. 30 is a schematic cross-sectional structure diagram of the IGBT including an emitter pad electrode EP and a gate pad electrode GP, which is an example of the semiconductor device to be applied to the power module according to the embodiments.

DESCRIPTION OF EMBODIMENTS

Figure 1:
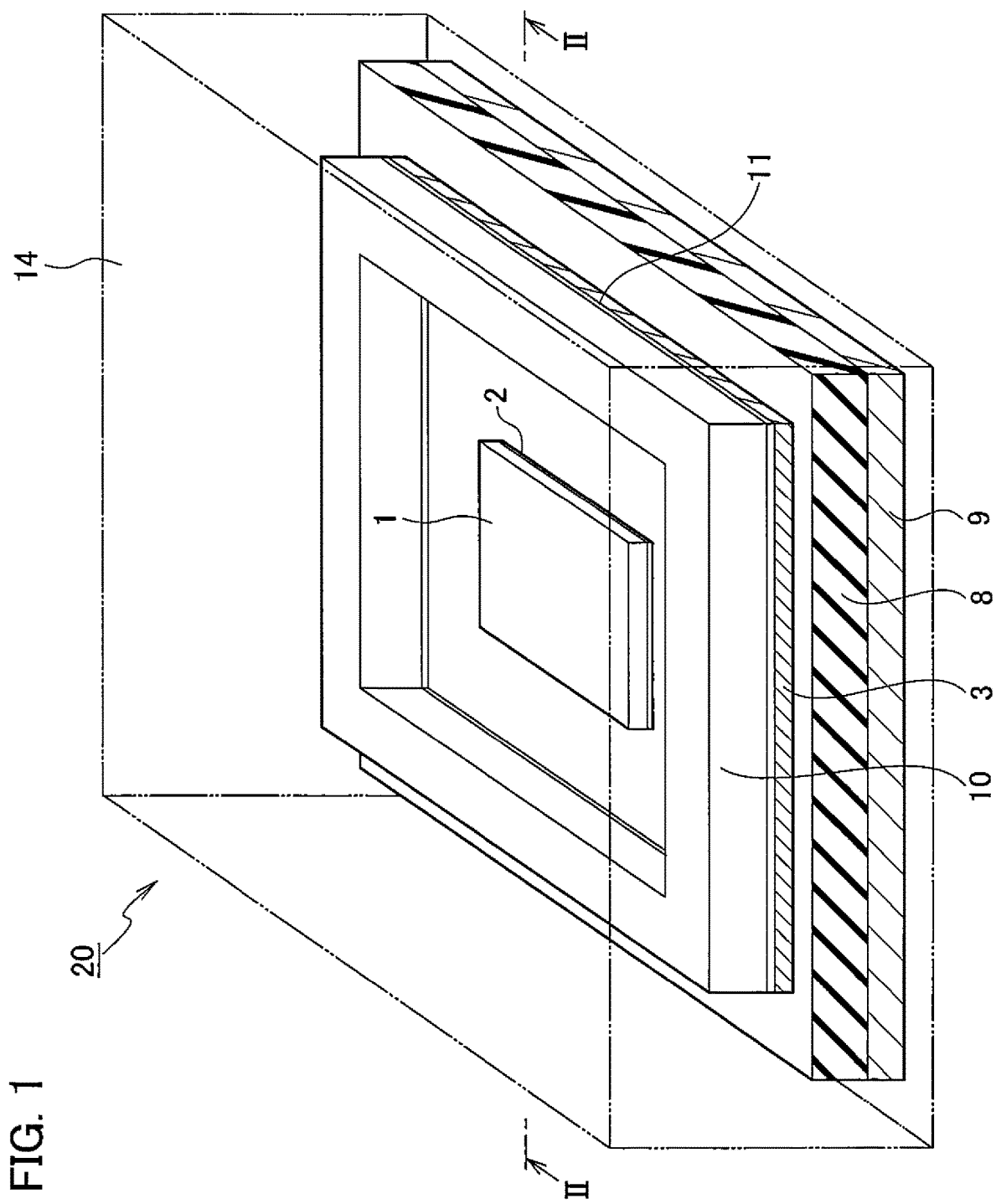
FIG. 1 is a bird's-eye view configuration diagram (perspective diagram) showing a principal portion of a power module according to the embodiments.

Next, certain embodiments will now be described with reference to drawings. In the description of the following drawings, the identical or similar reference numeral is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation.

Moreover, the embodiments shown hereinafter exemplify the apparatus and method for materializing the technical idea; and the embodiments does not specify the material, shape, structure, placement, etc. of each component part as the following. The embodiments may be changed without departing from the spirit or scope of claims.

(Configuration of Power Module)

FIG. 1 shows a bird's-eye view configuration of a power module 20 according to the embodiments. Moreover, FIG. 2 shows a schematic cross-sectional structure of a principal portion taken in line II-II of FIG. 1 in which a ceramic frame (frame member) 10 is disposed at a peripheral portion of a metallic pattern (metallic substrate) 3 formed on a ceramics substrate (mounting substrate) 8, in the power module 20 according to the embodiments.

Figure 3A:
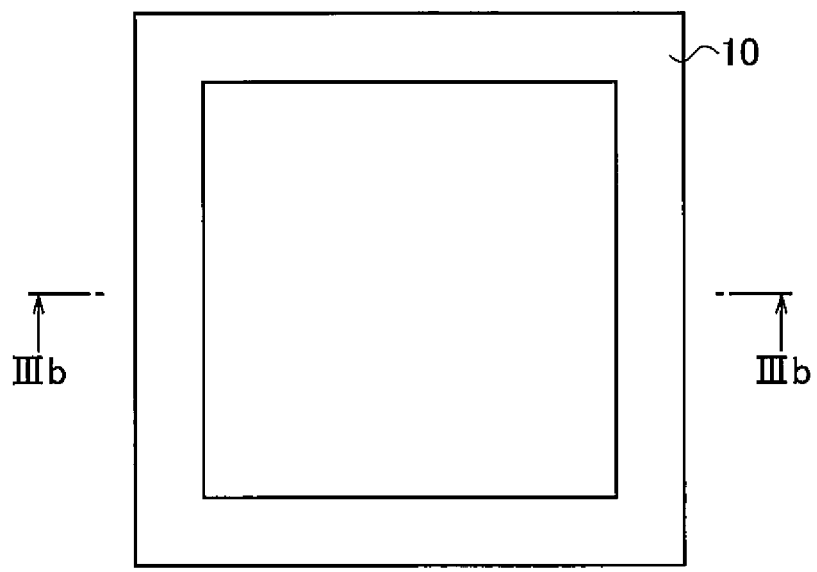
FIG. 3A is a planar pattern configuration diagram showing a ceramic frame disposed on a metallic pattern, in the power module according to the embodiments.
Figure 3B:
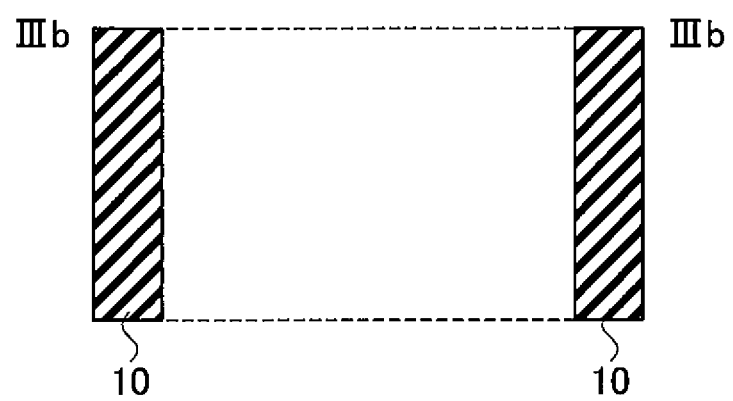
FIG. 3B is a schematic cross-sectional structure diagram taken in the line IIIb-IIIb of FIG. 3A.

Moreover, in the power module 20 according to the embodiments, FIG. 3A shows a planar pattern configuration of the ceramic frame 10 disposed at a peripheral portion of the metallic pattern 3 on the ceramics substrate 8, and FIG. 3B shows a schematic cross-sectional structure taken in the line IIIb-IIIb of FIG. 3A.

Figure 2:
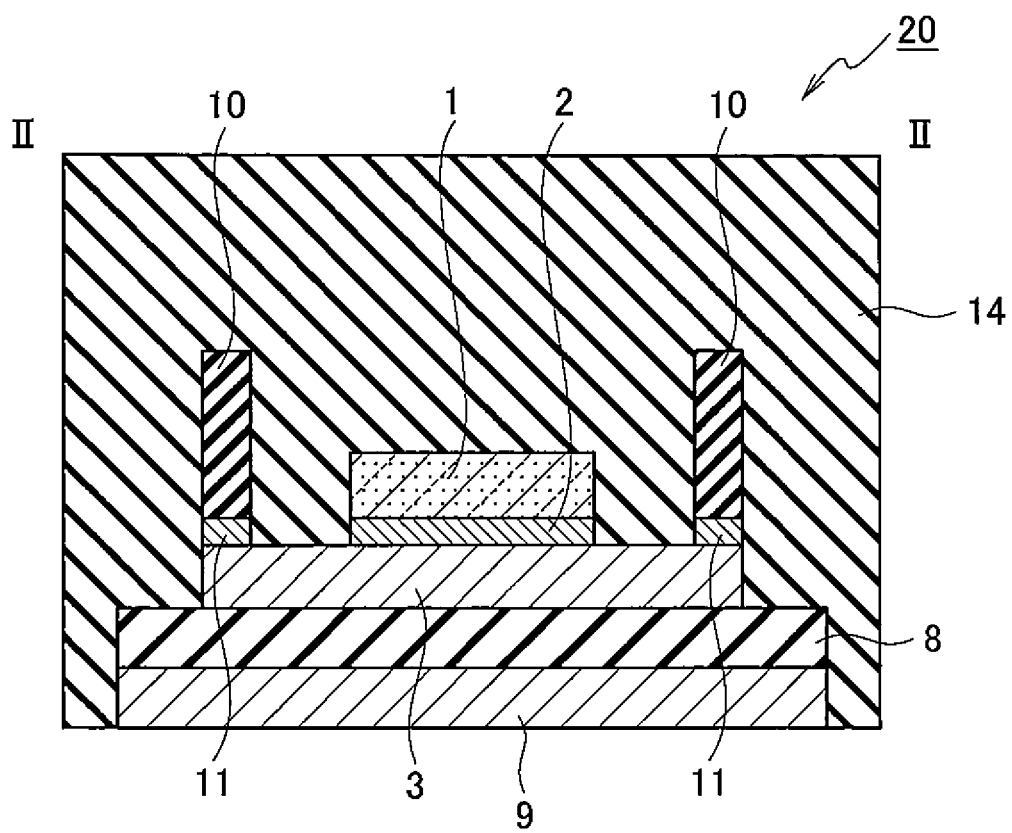
FIG. 2 is a schematic cross-sectional structure diagram taken in the line II-II of FIG. 1.

As shown in FIGS. 1 and 2, the principal portion of the power module 20 according to the embodiments includes: a ceramics substrate 8; a semiconductor device (semiconductor chip) 1 as a power device configured to be bonded near a center portion of the metallic pattern 3 on the ceramics substrate 8; a ceramic frame 10 disposed along an edge of the metallic pattern 3 on the ceramics substrate 8, a cross-sectional structure of the ceramic frame 10 configured to enclose the semiconductor device 1 being an I-shaped structure; and a resin layer 14 configured to seal the semiconductor device 1 and the ceramics substrate 8 so as to include the ceramic frame 10. In each drawings, although the semiconductor device 1 is illustrated as one element, it may be composed of a plurality of elements (e.g., modules).

The semiconductor device 1 is bonded with solder on an upper surface of the metallic pattern 3 via a bonding layer under chip (bonded portion) 2, and the ceramic frame 10 is bonded with solder on the upper surface of the metallic pattern 3 via a bonding layer under frame 11 capable of solder bonding by being subjected to metal sputtering etc.

The resin layer 14 configured to cover side surface portions of the ceramics substrate 8 is formed using a resin, etc., capable of transfer molding.

A Direct Bonding Copper (DBC) substrate formed of metallic patterns 3 and 9 having 0.8 mm of thickness which are respectively composed by including Cu frames and are respectively formed on front side and back side surfaces of ceramics having 0.3 mm of thickness, for example, is used for the ceramics substrate 8. Instead of the ceramics substrate 8, it is also possible to apply substrates formed by disposing a Cu frame on an insulating sheet, metallic substrates (e.g. Cu substrate), or the like.

Moreover, a Direct Brazed Aluminum (DBA) substrate or an Active Metal Brazed, Active Metal Bond (AMB) substrate is applicable thereto.

Moreover, it is possible to apply not only the ceramic frame 10 but also metallic members etc. having a CTE value lower than a CTE value of the metallic substrate and higher than a CTE value of the semiconductor device 1, as the frame member.

Moreover, it is also possible to apply composite materials etc. of ceramics and metal, as the frame member.

An operation/working-effect produced by providing the ceramic frame 10 will now be explained, hereafter. More specifically, a result at the time of conducting a simulation (stress test) will now be explained, in the power module 20 according to the embodiments.

Figure 4A:
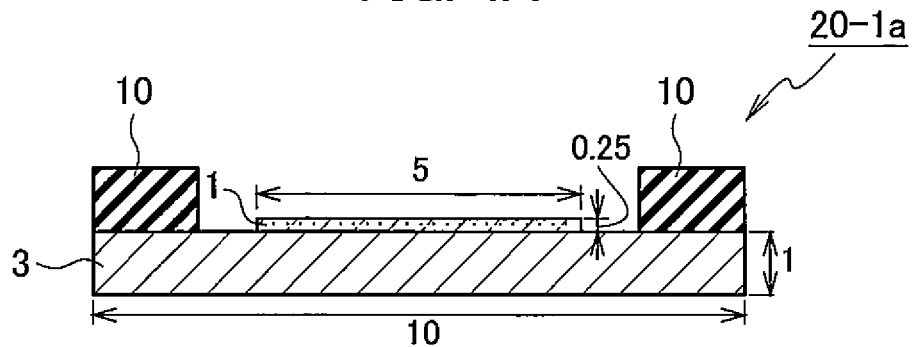
FIG. 4A is a schematic cross-sectional structure diagram showing a power module with a ceramic frame, in an example of a case where no resin layer is formed thereon.
Figure 4B:
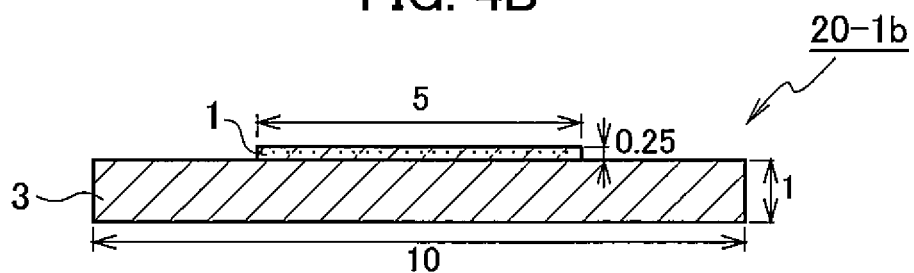
FIG. 4B is a schematic cross-sectional structure diagram showing a power module without a ceramic frame, in an example of a case where no resin layer is formed thereon.
Figure 4C:
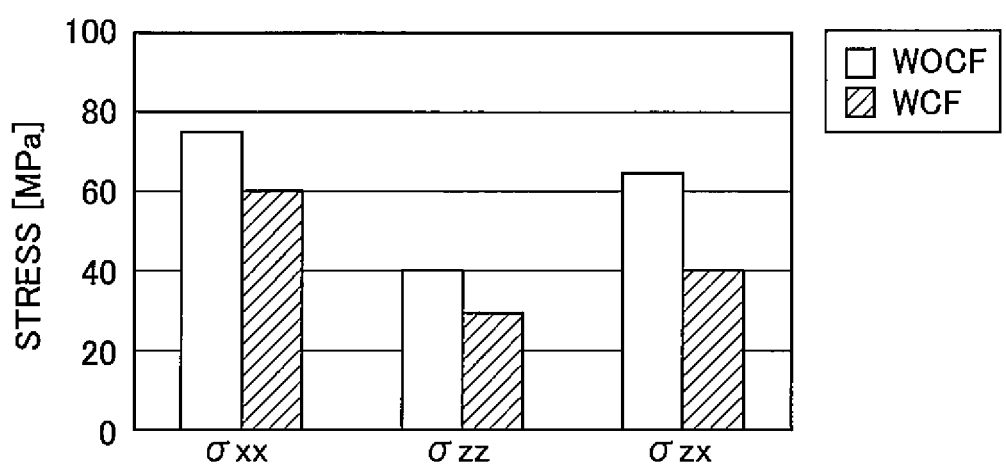
FIG. 4C shows a simulation result showing a stress applied to the bonded portion being compared for each component.

FIGS. 4A-4C respectively show stresses applied to the bonded portion between the semiconductor device 1 and the metallic pattern 3, comparing between a case of being provided with the ceramic frame 10 (WCF: With Ceramic Frame) and a case of being provided without the ceramic frame 10 (WOCF: Without Ceramic Frame), when no resin layer 14 is formed thereon. FIG. 4A shows a schematic cross-sectional structure of a power module 20-1a in the case of being provided with the ceramic frame 10, FIG. 4B shows a schematic cross-sectional structure of a power module 20-1*b* in the case of being provided without the ceramic frame 10, and FIG. 4C graphically shows each component ($\sigma xx$, $\sigma zz$, $\sigma zx$) of a simulation result of each stress.

For each power module 20-1*a*, 20-1*b*, a size (width×thickness) of a cross section of the metallic pattern 3 is set as 10×1, and a size (width×thickness) in a cross-sectional direction of the semiconductor device 1 is set as 5×0.25.

Figure 5A:
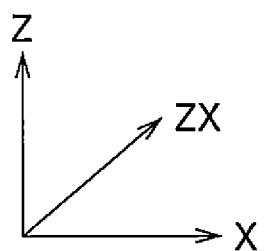
FIG. 5A is a conceptual diagram showing the component in each direction of the stress.
Figure 5B:
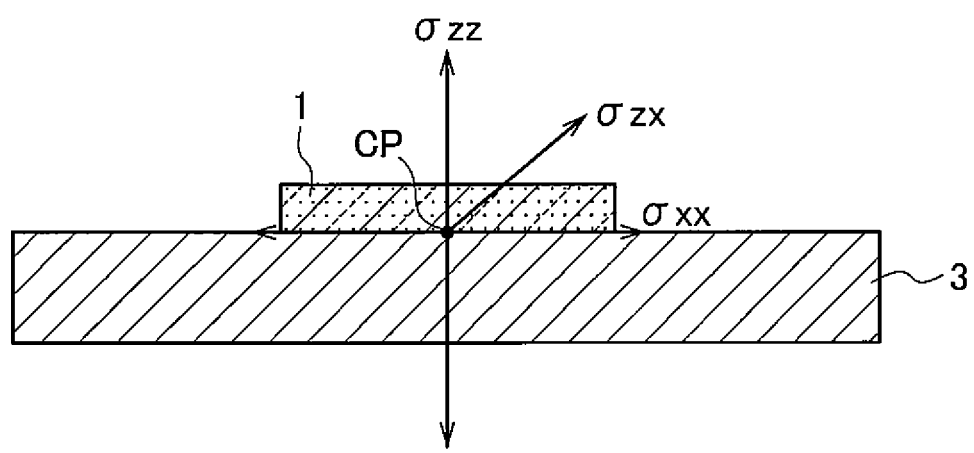
FIG. 5B is a schematic cross-sectional diagram for explaining each component of the stress applied to the bonded portion.

In this context, a component in the direction z of a stress applied to the bonded portion CP is referred to as the vertical stress $\sigma zz$, a component in the direction x of the stress applied to the bonded portion CP is referred to as the horizontal stress $\sigma xx$, and a component in the direction zx of the stress applied to the bonded portion CP is referred to as the shear stress $\sigma zx$, as shown in FIGS. 5A and 5B.

In the power module 20 (20-1*a*), it is possible to reduce the stress applied to the bonded portion CP for each component by being provided with the ceramic frame 10, as clearly also from FIG. 4C. In particular, the shear stress $\sigma zx$ can be reduced more remarkably than other stresses $\sigma xx$ and $\sigma zz$.

Figure 6A:
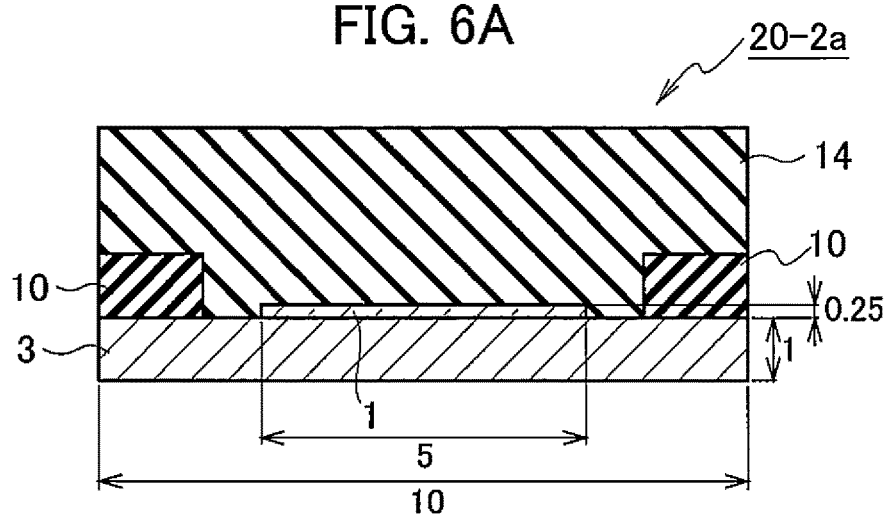
FIG. 6A is a schematic cross-sectional structure diagram showing a power module with a ceramic frame, in an example of a case where a resin layer is formed thereon.
Figure 6B:
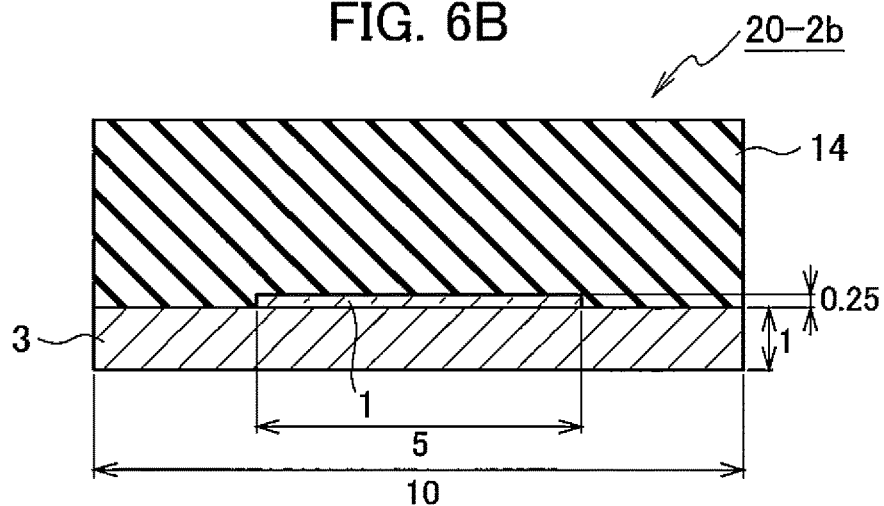
FIG. 6B is a schematic cross-sectional structure diagram showing a power module without a ceramic frame, in an example of a case where a resin layer is formed thereon.
Figure 6C:
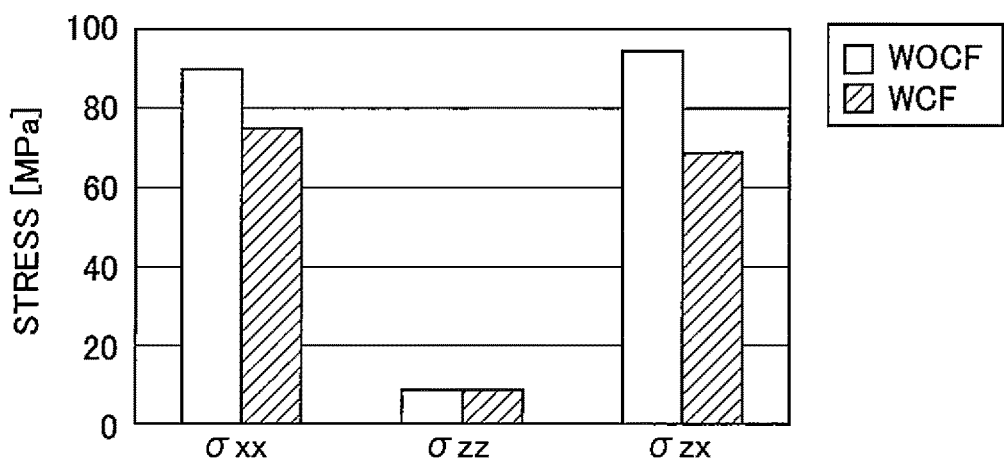
FIG. 6C shows a simulation result showing a stress applied to the bonded portion being compared for each component.

FIGS. 6A-6C respectively show stresses applied to the bonded portion between the semiconductor device 1 and the metallic pattern 3, comparing between a case of being provided with the ceramic frame 10 (WCF) and a case of being provided without the ceramic frame 10 (WOCF), when the resin layer 14 is formed thereon. FIG. 6A shows a schematic cross-sectional structure of a power module 20-2*a* in the case of being provided with the ceramic frame 10, FIG. 6B shows a schematic cross-sectional structure of a power module 20-2*b* in the case of being provided without the ceramic frame 10, and FIG. 6C graphically shows each component ($\sigma xx$, $\sigma zz$, $\sigma zx$) of a simulation result of each stress.

In the power module 20 (20-2*a*), it is possible to reduce the stress applied to the bonded portion CP for each component by being provided with the ceramic frame 10, as clearly also from FIG. 6C. In particular, the shear stress $\sigma zx$ can be reduced more remarkably than other stresses $\sigma xx$ and $\sigma zz$.

Consequently, it is possible to reduce the shear stress $\sigma zx$ applied to the bonded portion CP regardless of the presence or absence of the resin layer 14 by providing the ceramic frame 10 in the power module 20.

Accordingly, degradation (such as a rupture) which occurs in the bonded portion CP during a heat cycle test can be suppressed by being provided with the ceramic frame 10, even when the difference between the CTE value of the semiconductor device 1 and the CTE value of the metallic pattern 3 is relatively large.

FIGS. 7-10 show the operation/working-effect produced by being providing the ceramic frame 10 in order to be further explained in detail, in the power module 20 according to the embodiments.

Figure 7A:
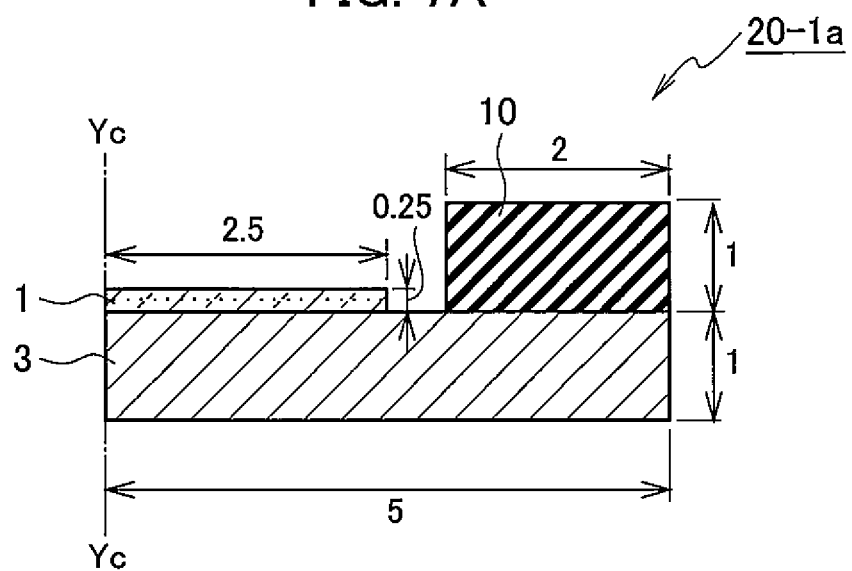
FIG. 7A is a schematic cross-sectional structure diagram axisymmetrically showing a power module with a ceramic frame, in an example of a case where no resin layer is formed thereon.
Figure 7B:
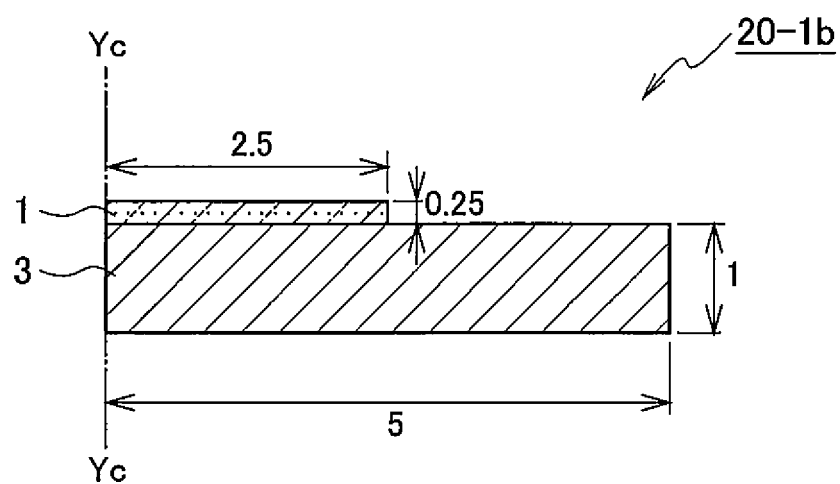
FIG. 7B is a schematic cross-sectional structure diagram axisymmetrically showing a power module without a ceramic frame, in an example of a case where no resin layer is formed thereon.
Figure 8A:
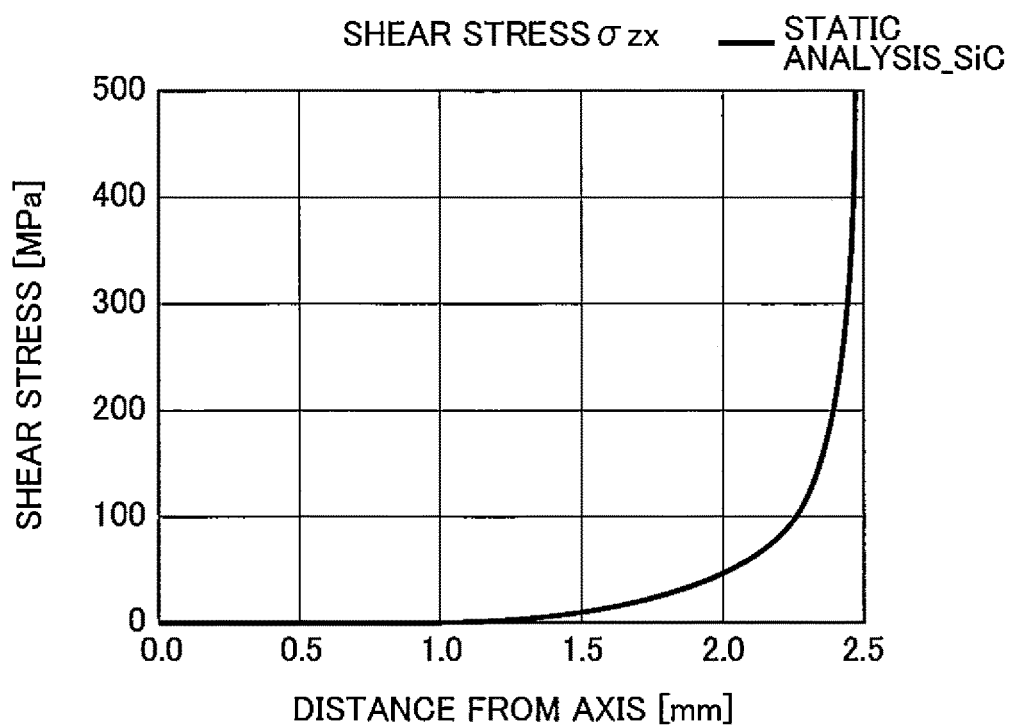
FIG. 8A shows a simulation result showing a relationship between a shear stress and a distance from an axis of the power module with a ceramic frame, in an example of a case where no resin layer is formed thereon.
Figure 8B:
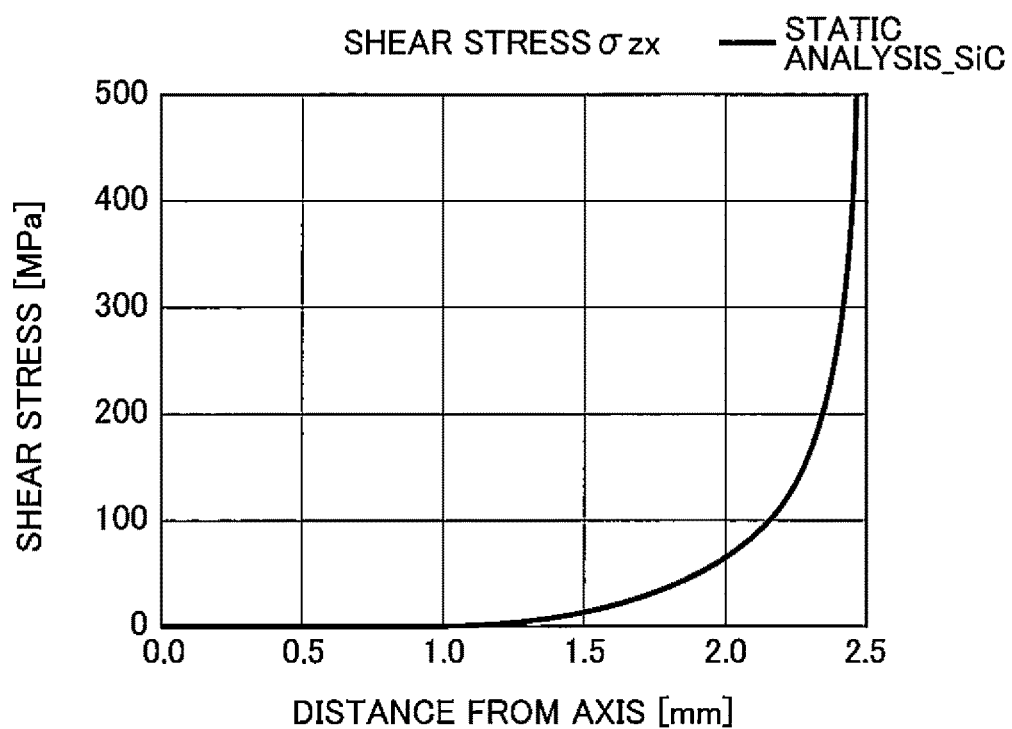
FIG. 8B shows a simulation result showing a relationship between a shear stress and a distance from an axis of the power module without a ceramic frame, in an example of a case where no resin layer is formed thereon.

FIGS. 7 and 8 respectively show stresses applied to the bonded portion between the semiconductor device (SiC) 1 and the metallic pattern (Cu substrate) 3, comparing between a case of being provided with the ceramic frame (SiN) 10 and a case of being provided without the ceramic frame (SiN) 10, when the resin layer (Resin) 14 is not formed thereon. FIG. 7A shows a schematic cross-sectional structure of the power module 20-1*a* in the case of being provided with the ceramic frame 10 axisymmetrically taken in the line Yc-Yc, and FIG. 7B shows a schematic cross-sectional structure of the power module 20-1*b* in the case of being provided without the ceramic frame 10 axisymmetrically taken in the line Yc-Yc. Moreover, FIG. 8A shows a stress simulation result showing a relationship between a distance from the axis of the power module 20-1*a* and a shear stress $\sigma zx$, and FIG. 8B shows a stress simulation result showing a relationship between a distance from the axis of the power module 20-1*b* and a shear stress $\sigma zx$.

In the power module 20-1*a* axisymmetrically shown, the thickness of the cross section of the ceramic frame 10 is thicker than the thickness of the semiconductor device 1, and the size (width×thickness) of the cross section of the ceramic frame 10 is set to 2×1 (the approximately same thickness as the metallic pattern 3), for example.

In the case of the structure shown in FIG. 7B, the stress concentrates mostly on the boundary portion of the bonded portion between the semiconductor device 1 and the metallic pattern 3. On the other hand, in the case of a structure shown in FIG. 7A, although the stress concentrates on the boundary portion of the bonded portion between the semiconductor device 1 and the metallic pattern 3, the stress concentration is relatively relaxed.

Figure 9A:
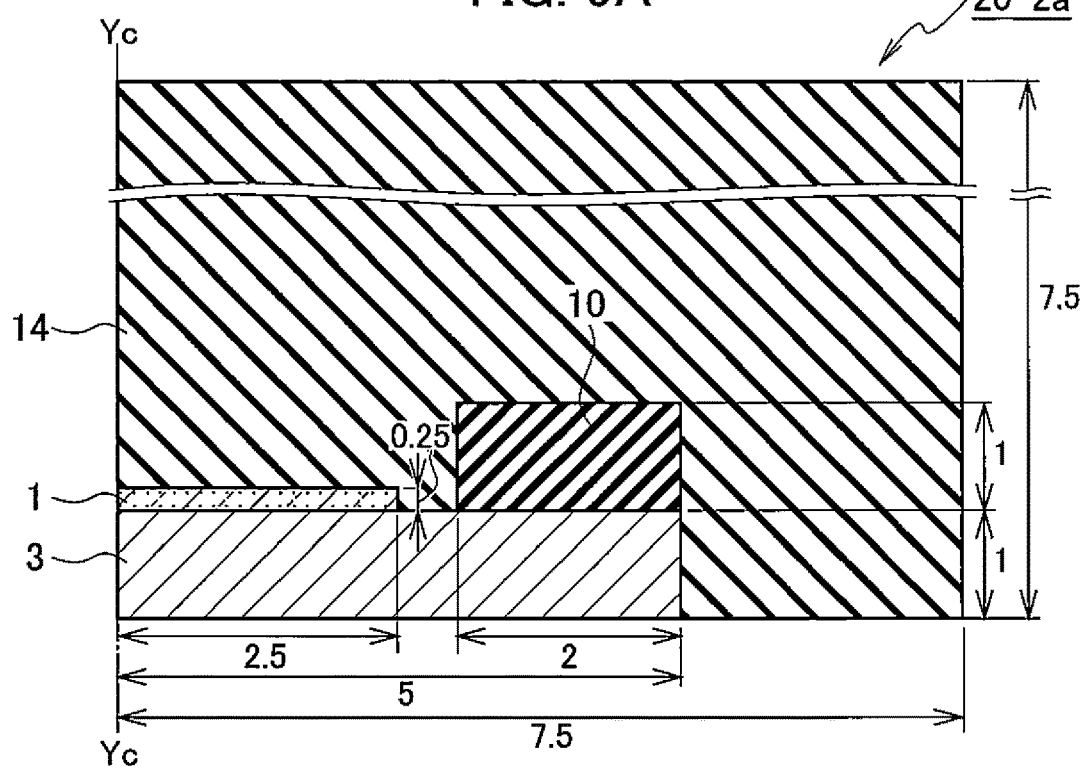
FIG. 9A is a schematic cross-sectional structure diagram axisymmetrically showing a power module with a ceramic frame, in an example of a case where a resin layer is formed thereon.
Figure 9B:
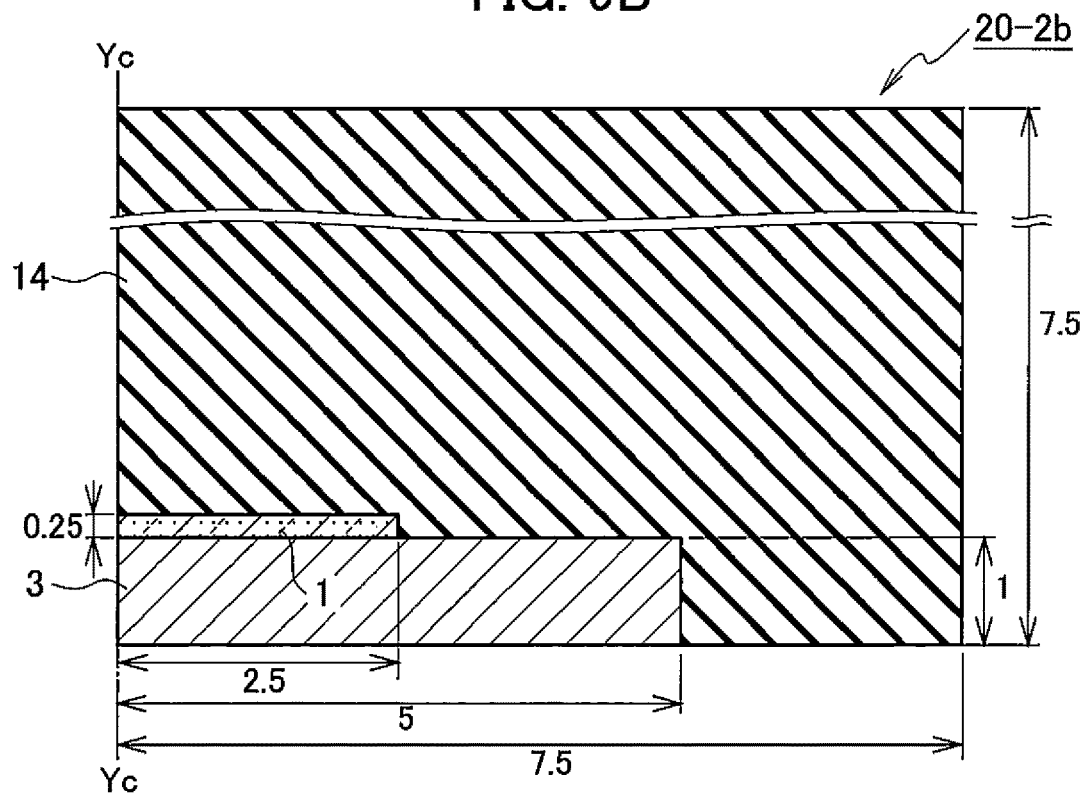
FIG. 9B is a schematic cross-sectional structure diagram axisymmetrically showing a power module without a ceramic frame, in an example of a case where a resin layer is formed thereon.

FIGS. 9 and 10 respectively show stresses applied to the bonded portion between the semiconductor device (SiC) 1 and the metallic pattern (Cu substrate) 3, comparing between a case of being provided with the ceramic frame (SiN) 10 and a case of being provided without the ceramic frame (SiN) 10, when the resin layer (Resin) 14 is formed thereon. FIG. 9A shows a schematic cross-sectional structure of the power module 20-2*a* in the case of being provided with the ceramic frame 10 axisymmetrically taken in the line Yc-Yc, and FIG. 9B shows a schematic cross-sectional structure of the power module 20-2*b* in the case of being provided without the ceramic frame 10 axisymmetrically taken in the line Yc-Yc. Moreover, FIG. 10A shows a stress simulation result showing a relationship between a distance from the axis of the power module 20-2*a* and a shear stress $\sigma zx$, and FIG. 10B shows a stress simulation result showing a relationship between a distance from the axis of the power module 20-2*b* and a shear stress $\sigma zx$.

In the power modules 20-2*a* and 20-2*b* axisymmetrically shown, the size (width×thickness) of the cross section of the resin layer 14 is set to 15×7.5.

In the case of the structure shown in FIG. 9B, the stress concentrates mostly on the boundary portion of the bonded portion between the semiconductor device 1 and the metallic pattern 3. On the other hand, in the case of a structure shown in FIG. 9A, although the stress concentrates on the boundary portion of the bonded portion between the semiconductor device 1 and the metallic pattern 3, the stress concentration is relatively relaxed.

Consequently, the ceramic frame 10 has a function of suppressing the shear stress $\sigma zx$ according to the difference between the CTE value of the metallic pattern 3 and the CTE value of the semiconductor device 1. More specifically, the ceramic frame 10 has an effect of reducing the CTE value of Cu so that the metallic pattern 3 is not shrunk.

Accordingly, even if the transfer-mold type power module is adopted, the shear stress $\sigma zx$ applied to the bonded portion CP at the time of the heat cycle test, etc. can be remarkably reduced by providing the ceramic frame 10 having the CTE value smaller than the CTE value of Cu of the metallic pattern 3 but larger than the CTE value of the semiconductor device 1, as described above.

For example, when the CTE value of the semiconductor device (Sic) 1 is approximately 3 ppm/K and the CTE value of the metallic pattern (Cu) 3 is approximately 16 ppm/K, the ceramic frame (SiN) 10 having the CTE value of approximately 2-10 ppm/K may be provided, in the power module 20 according to the embodiments.

In addition, the CTE value of the resin layer 14 is set as approximately 12-14 ppm/K, in the power module 20 according to the embodiments.

(Fabrication Method)

A fabrication method of the power module 20 according to the embodiments mainly includes: forming a ceramic frame 10 on a peripheral portion of a metallic pattern 3 on a ceramics substrate 8; disposing a semiconductor device 1 on the metallic pattern 3 inside the ceramic frame 10; and forming a resin layer 14 configured to seal the semiconductor device 1 and the ceramics substrate 8 so as to include the ceramic frame 10.

The fabrication method of the power module according to the embodiments will now be explained with reference to FIGS. 11-13.

Figure 11A:
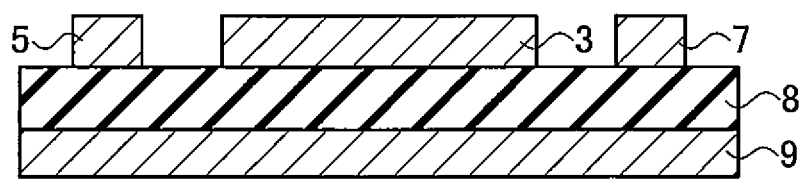
FIG. 11A is a schematic cross-sectional structure diagram showing one process of a fabrication method of the power module according to the embodiments (Phase 1).

(a) Firstly, as shown in FIG. 11A, a DBC substrate formed by forming respectively Cu frames on a front side surface and a back side surface of a ceramics substrate 8 is prepared for as a mounting substrate. Then, a metallic pattern 3 having a CTE value of approximately 16 ppm/K, and patterned metallic patterns (copper foils) 5 and 7 are formed on the front side surface of the ceramics substrate 8. A metallic pattern (metallic frame) 9 is formed on the back side surface of the ceramics substrate 8.

Figure 11B:
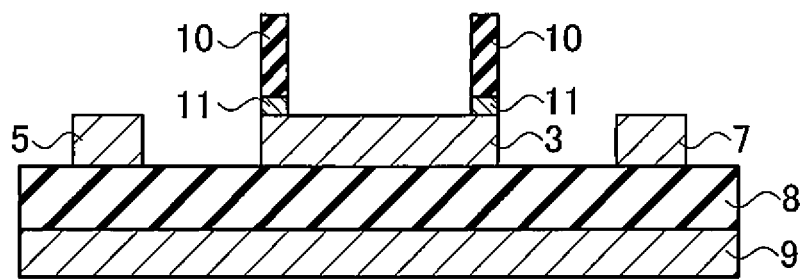
FIG. 11B is a schematic cross-sectional structure diagram showing one process of the fabrication method of the power module according to the embodiments (Phase 2).

(b) Next, as shown in FIG. 11B, a ceramic frame 10 having a CTE value of approximately 2-10 ppm/K is formed via a bonding layer under frame 11 on the metallic pattern 3 on the front side surface of the ceramics substrate 8. A soldering layer or an adhesive layer are applicable to the bonding layer under frame 11, for example.

Figure 12A:
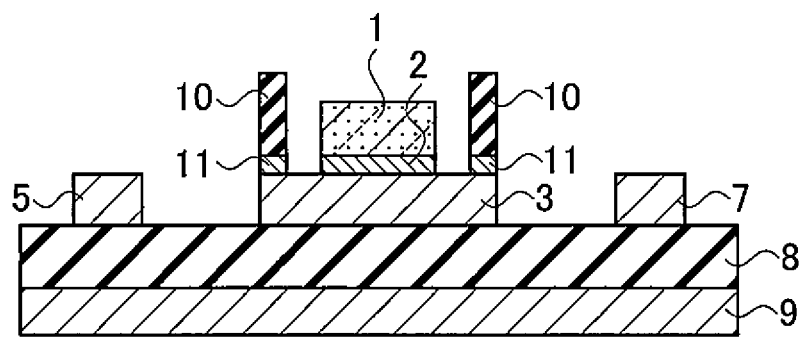
FIG. 12A is a schematic cross-sectional structure diagram showing one process of the fabrication method of the power module according to the embodiments (Phase 3).

(c) Next, as shown in FIG. 12A, an SiC based semiconductor device 1 having a CTE value of approximately 3 ppm is bonded with die bonding via a bonding layer 2 under chip on the metallic pattern 3 on the front side surface of the ceramics substrate 8 inside the ceramic frame 10. For the bonding layer 2 under chip, a soldering layer or an Ag sintered layer are applicable. In addition, an Ag nanoparticle layer etc. which are previously formed on a back side surface of the semiconductor device 1 may be used for the bonding layer 2 under chip.

In addition, the processing order of (b) forming a ceramic frame 10 on the metallic pattern 3 and (c) bonding the semiconductor device 1 on the metallic pattern 3 may also be reversed. Accordingly, the ceramic frame 10 may be formed, after bonding of the semiconductor device 1.

Figure 12B:
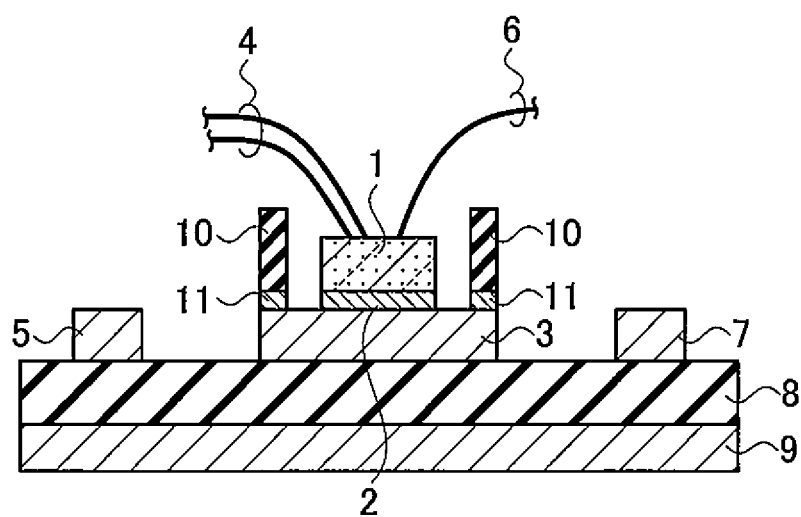
FIG. 12B is a schematic cross-sectional structure diagram showing one process of the fabrication method of the power module according to the embodiments (Phase 4).

(d) Next, as shown in FIG. 12B, the bonding wires 4 and 6 are respectively bonded to a gate electrode and a source electrode of the semiconductor device 1. In this case, the bonding wires 4 and 6 may respectively be bonding-connected on the patterned metallic patterns 5 and 7. The bonding wires 4 and 6 can be formed by including Al, AlCu, or the like, for example.

Figure 13A:
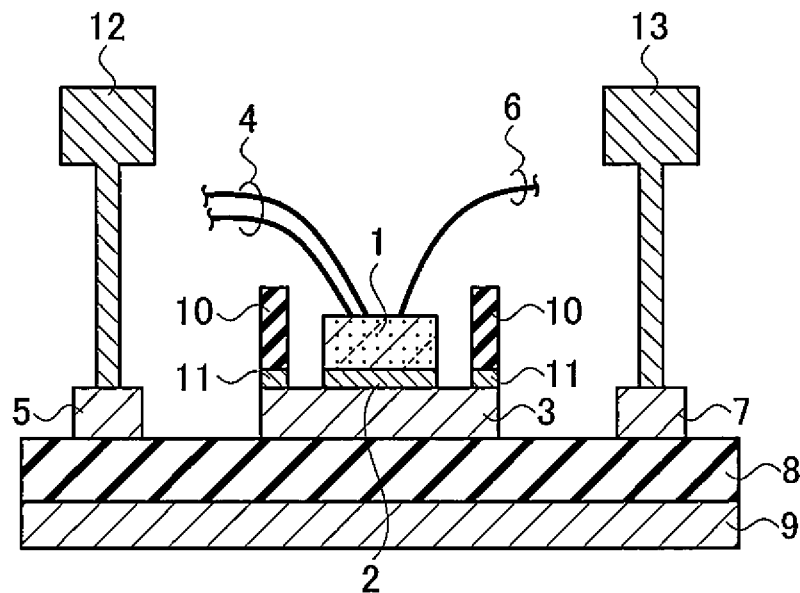
FIG. 13A is a schematic cross-sectional structure diagram showing one process of the fabrication method of the power module according to the embodiments (Phase 5).

(e) Next, as shown in FIG. 13A, block terminal electrodes 12 and 13 are respectively connected via soldering layers (not shown) on the metallic patterns 5 and 7 patterned on the front side surface of the ceramics substrate 8.

Figure 13B:
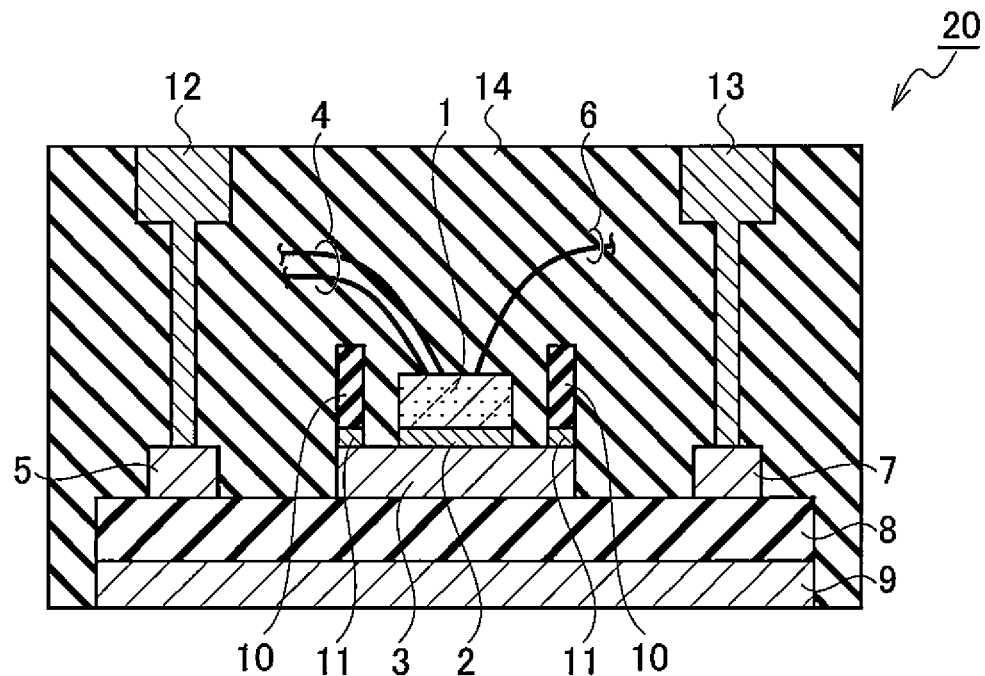
FIG. 13B is a schematic cross-sectional structure diagram showing one process of the fabrication method of the power module according to the embodiments (Phase 6).

(f) Next, as shown in FIG. 13B, a resin layer 14 configured to seal the semiconductor device 1 and the ceramics substrate 8 so as to include the inside of the ceramic frame 10 is formed to seal the whole of the power module. In this case, a transfer molding process is applicable to the formation of the resin layer 14.

Figure 14:
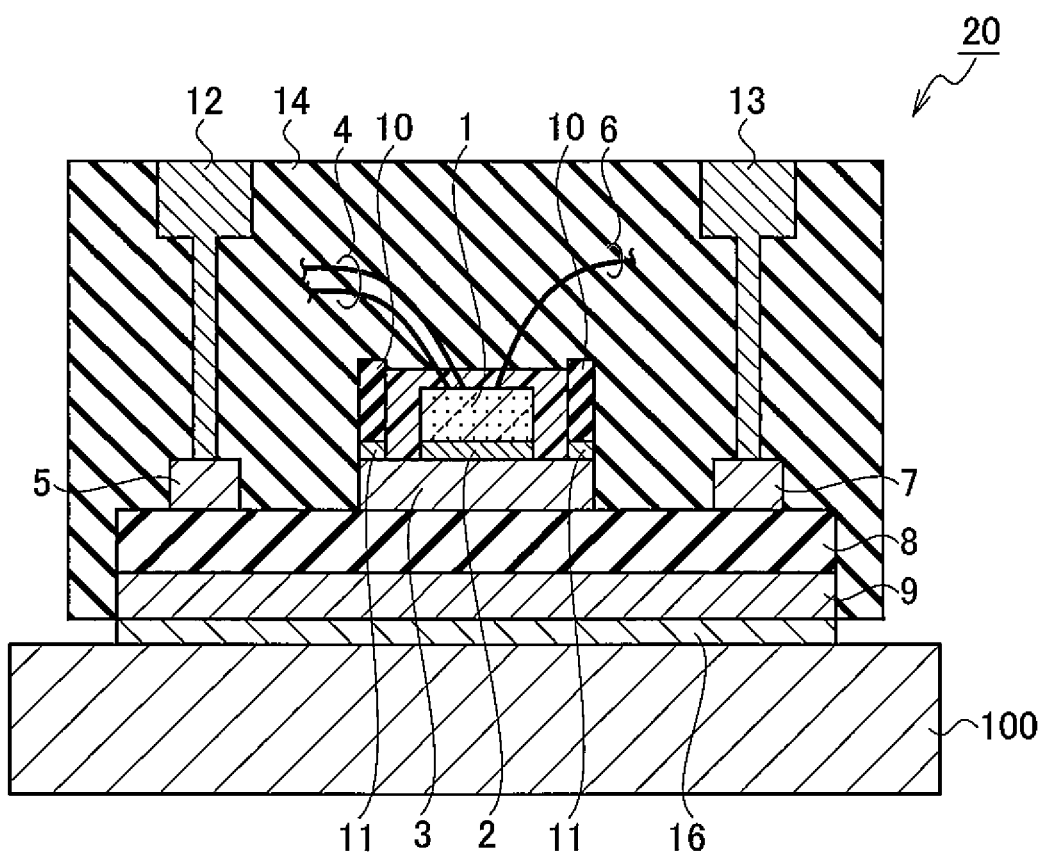
FIG. 14 is a schematic cross-sectional structure diagram showing one process of the fabrication method of the power module according to the embodiments (Phase 7), in an example of a case where a heat sink is formed thereto.

The power module 20 according to the embodiments includes a heat sink 100 as shown in FIG. 14, for example, and the ceramics substrate 8 may be disposed on the heat sink 100. In this case, the heat sink 100 is formed by including a Cu base for heat radiation, for example. The metallic pattern 9 formed on the back side surface of the ceramics substrate 8 is connected to the heat sink 100 via a soldering layer 16 under substrate.

In the power module 20 according to the embodiments, a simplification of the module fabrication process and a miniaturization of the module can be realized since the module fabrication can be realized without attachment of a case.

In the power module 20 according to the embodiments, since structural members, e.g. a case, are unnecessary, the number of parts is reduced, and thereby realizing cost reduction.

A height of the ceramic frame 10 is approximately 5 mm to approximately 0.2 mm, for example. Moreover, the ceramic frame 10 is formed in an approximately square shape. The height and width of the frame are preferable to be made as small as possible so that the chip size is suitable for the purpose of a miniaturization and a cost reduction, in the light of a sufficiently effective design calculated from the simulation result etc.

In the case of the ceramic frame 10 of which the frame member is formed with ceramics, the ceramics may be formed by including: $Al_2O_3$, AlN, SiN, AlSiC; or SiC of which at least the front side surface has insulating property, for example. Moreover, a front side surface of $Al_2O_3$ may be subjected to plating processing of W, Ni, the Au, or the like.

Moreover, if forming the frame member with a metallic member, the frame member may be formed by milling etc.

Moreover, a thickness of the resin layer 14 is approximately 4.0 mm to approximately 10 mm, for example.

The block terminal electrodes 12 and 13 may be formed by including Cu, CuMo, or the like.

The ceramic substrate 8 may be formed by including: $Al_2O_3$, AlN, SiN, AlSiC; or SiC of which at least the front side surface has insulating property, for example.

Modified Example 1

Figure 15A:
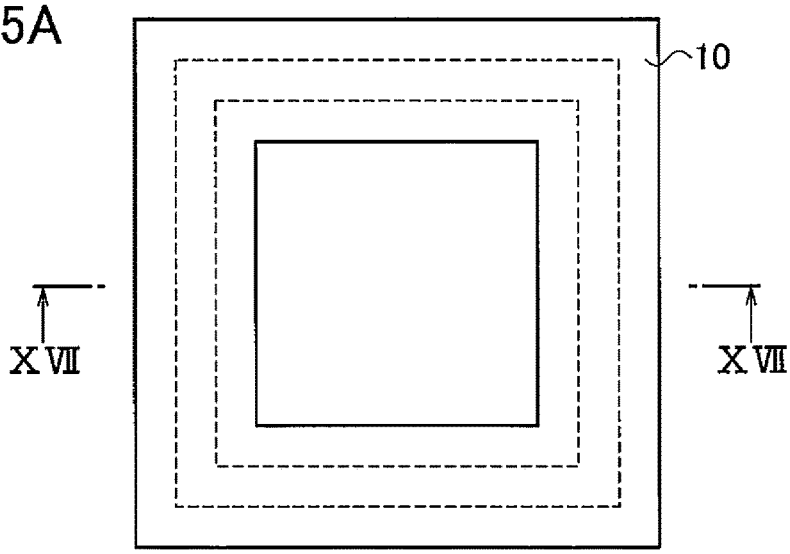
FIG. 15A is a planar pattern configuration diagram showing a ceramic frame, in a power module according to a modified example 1 of the embodiments.
Figure 15B:
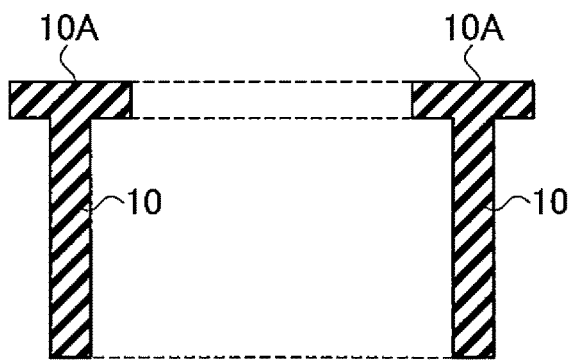
FIG. 15B is a schematic cross-sectional structure diagram taken in the line XVII-XVII of FIG. 15A.

FIG. 15A shows a planar pattern configuration of a ceramic frame 10, in the power module according to a modified example 1 of the embodiments, and FIG. 15B shows a schematic cross-sectional structure taken in the line XVII-XVII of FIG. 15A.

In the power module according to the modified example 1 of the embodiments, a cross-sectional structure of the ceramic frame 10 may have a T-shaped structure by being provided with a ceramic frame 10 including a cap portion 10A of a protruding structure, as shown in FIG. 15B. An engaging degree of the resin layer 14 can be improved and thereby adhesibility thereof can be improved, by being provided with the ceramic frame 10 including the cap portion 10A of the protruding structure.

Modified Example 2

Figure 15C:
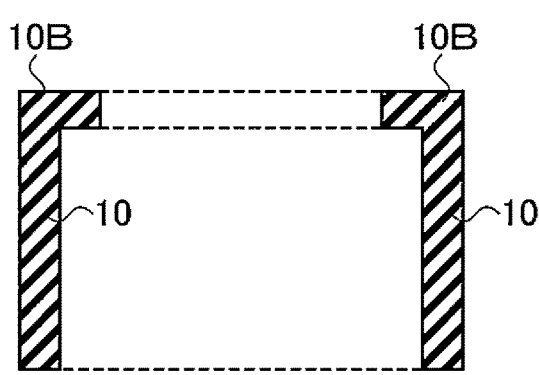
FIG. 15C is a schematic cross-sectional structure diagram showing a ceramic frame, in a power module according to a modified example 2 of the embodiments.

FIG. 15C shows a schematic cross-sectional structure of a ceramic frame 10, in a power module according to a modified example 2 of the embodiments.

In the power module according to the modified example 2 of the embodiments, a cross-sectional structure of the ceramic frame 10 may have an inverted-L-shaped structure or Γ (gamma)-shaped structure by being provided with a cap portion 10B, as shown in FIG. 15C. An engaging degree of the resin layer 14 can be improved and thereby adhesibility thereof can be improved, by being provided with the ceramic frame 10 including the cap portion 10B of the protruding structure.

Modified Example 3

Figure 15D:
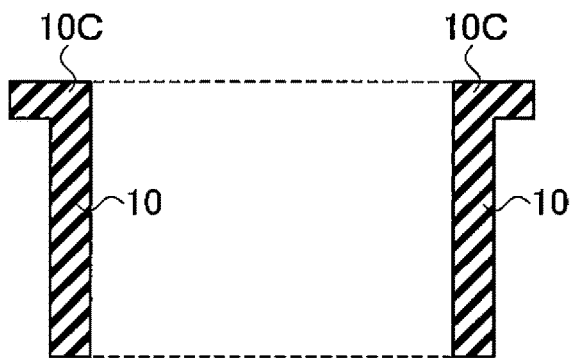
FIG. 15D is a schematic cross-sectional structure diagram showing a ceramic frame, in a power module according to a modified example 3 of the embodiments.

FIG. 15D shows a schematic cross-sectional structure of a ceramic frame 10, in a power module according to a modified example 3 of the embodiments.

Also in the power module according to the modified example 3 of the embodiments, a cross-sectional structure of the ceramic frame 10 may have an inverted-L-shaped structure or Γ-shaped structure by being provided with a cap portion 10C, as shown in FIG. 15D. An engaging degree of the resin layer 14 can be improved and thereby adhesibility thereof can be improved, by being provided with the ceramic frame 10 including the cap portion 10C of the protruding structure.

Modified Example 4

Figure 16A:
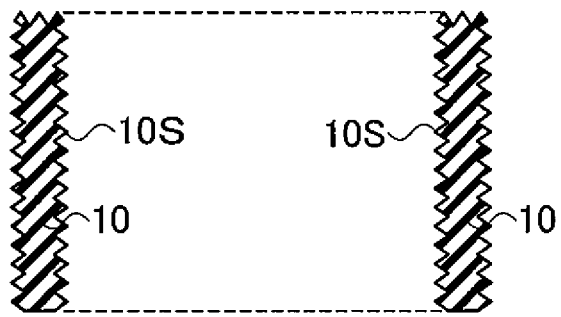
FIG. 16A is a schematic cross-sectional structure diagram showing a ceramic frame, in a power module according to a modified example 4 of the embodiments.

FIG. 16A shows a schematic cross-sectional structure of a ceramic frame 10, in a power module according to a modified example 4 of the embodiments.

In the power module according to the modified example 4 of the embodiments, a surface roughening process may be applied to a surface 10S of a ceramic frame 10 having an I-shaped structure. The surface roughening process to be applied to the ceramic frame 10 can be realized by a sandblast processing etc. Thus, an engaging degree of the resin layer 14 can be further improved and thereby adhesibility thereof can be improved, by applying the surface roughening process to the surface 10S of the ceramic frame 10.

Modified Example 5

Figure 16B:
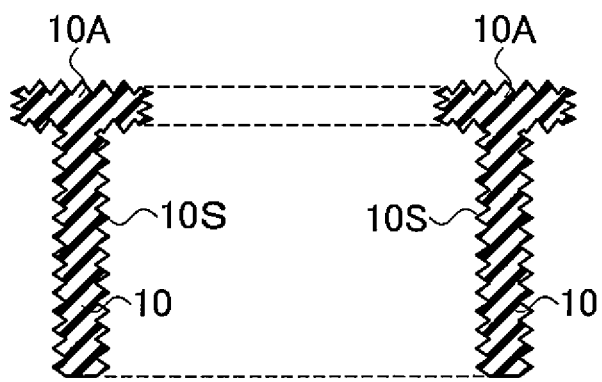
FIG. 16B is a schematic cross-sectional structure diagram showing a ceramic frame, in a power module according to a modified example 5 of the embodiments.

FIG. 16B shows a schematic cross-sectional structure of a ceramic frame 10, in a power module according to a modified example 5 of the embodiments.

In the power module according to the modified example 5 of the embodiments, a surface roughening process may be applied to a surface 10S of a ceramic frame 10 having a T-shaped structure, by being provided with the cap portion 10A. Thus, an engaging degree of the resin layer 14 can be further improved and thereby adhesibility thereof can be improved, by applying the surface roughening process to the surface 10S of the ceramic frame 10.

Modified Example 6

Figure 16C:
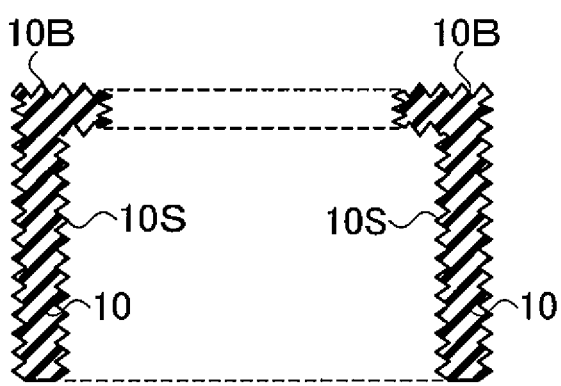
FIG. 16C is a schematic cross-sectional structure diagram showing a ceramic frame, in a power module according to a modified example 6 of the embodiments.

FIG. 16C shows a schematic cross-sectional structure of a ceramic frame 10, in a power module according to a modified example 6 of the embodiments.

In the power module according to the modified example 6 of the embodiments, a surface roughening process may be applied to a surface 10S of a ceramic frame 10 having an inverted-L-shaped structure or Γ-shaped structure, by being provided with the cap portion 10B. Thus, an engaging degree of the resin layer 14 can be further improved and thereby adhesibility thereof can be improved, by applying the surface roughening process to the surface 10S of the ceramic frame 10.

Modified Example 7

Figure 16D:
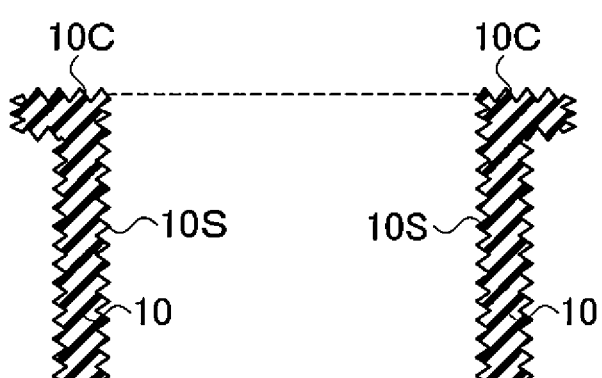
FIG. 16D is a schematic cross-sectional structure diagram showing a ceramic frame, in a power module according to a modified example 7 of the embodiments.

FIG. 16D shows a schematic cross-sectional structure of a ceramic frame 10, in a power module according to a modified example 7 of the embodiments.

In the power module according to the modified example 7 of the embodiments, a surface roughening process may be applied to a surface 10S of a ceramic frame 10 having an inverted-L-shaped structure or Γ-shaped structure, by being provided with the cap portion 10C. Thus, an engaging degree of the resin layer 14 can be further improved and thereby adhesibility thereof can be improved, by applying the surface roughening process to the surface 10S of the ceramic frame 10.

Modified Example 8

FIGS. 17A-17D show planar pattern configurations of ceramic frames 10, in a power module according to a modified example 8 of the embodiments.

Figure 17A:
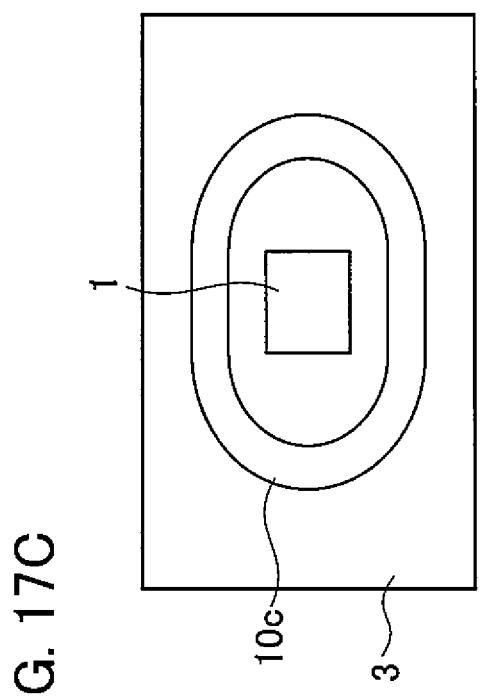
FIG. 17A is a planar pattern configuration diagram showing a ceramic frame in an example of a case where one semiconductor device is mounted therein (Phase 1-1), in a power module according to a modified example 8 of the embodiments.

In the power module according to the modified example 8 of the embodiments, a ceramic frame 10a of rectangular shape, e.g. rectangle, may be adopted, as shown in FIG. 17A. Moreover, the ceramic frame is not limited to the ceramic frame 10a enclosing the periphery of one semiconductor device 1, but a ceramic frame 10b enclosing the periphery of a plurality of semiconductor devices 1A and 1B as shown in FIG. 17B may be adopted.

Figure 17C:
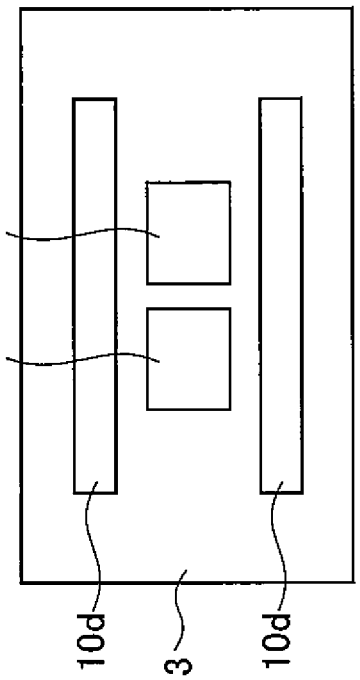
FIG. 17C is a planar pattern configuration diagram showing a ceramic frame in an example of a case where one semiconductor device is mounted therein (Phase 2), in the power module according to the modified example 8 of the embodiments.
Figure 17B:
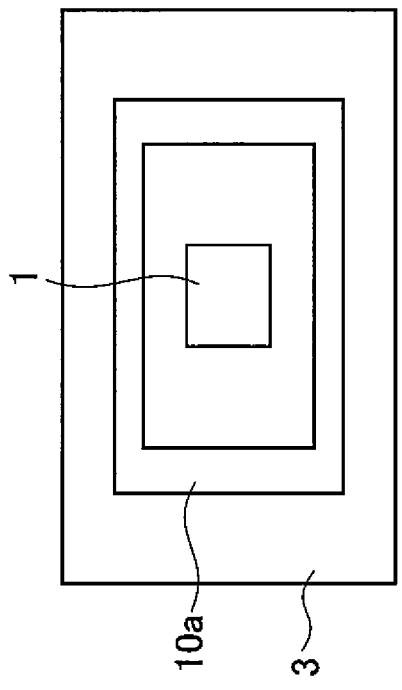
FIG. 17B is a planar pattern configuration diagram showing a ceramic frame in an example of a case where two semiconductor devices are mounted therein (Phase 1-2), in the power module according to the modified example 8 of the embodiments.
Figure 17D:
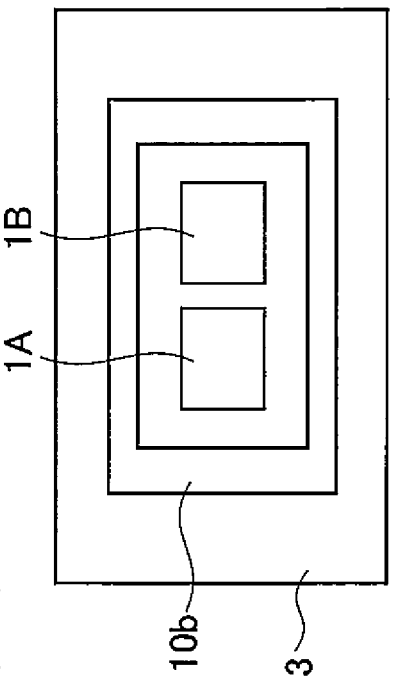
FIG. 17D is a planar pattern configuration diagram showing a ceramic frame in an example of a case where two semiconductor devices are mounted therein (Phase 3), in the power module according to the modified example 8 of the embodiments.

Moreover, a circle-shaped (e.g. circular or elliptical) ceramic frame 10c may be adopted, as shown in FIG. 17C. Moreover, a line-shaped (e.g. straight line-shaped) ceramic frame 10d disposed along a long side of the metallic pattern 3 near the semiconductor devices 1A and 1B, without enclosing the periphery of semiconductor devices 1A and 1B, may be adopted, as shown in FIG. 17D.

Furthermore, the ceramic frame 10 is not limited to a structure of being arranged along an edge of the metallic pattern 3, but the ceramic frame 10 may be arranged at an inner side than the edge of the metallic pattern 3 as shown in FIGS. 17A-17D. Moreover, each of the ceramic frames 10a-10d respectively shown in FIGS. 17A-17D may not always be integral-type frame, but may be divided to be fragmentarily arranged.

Although not illustrated, it is possible to adopt: a configuration of enclosing the periphery of the plurality of the semiconductor devices 1A and 1B by a square-shaped ceramic frame 10 arranged along an edge of the metallic pattern 3 as shown in FIG. 1; a configuration respectively enclosing the periphery of the plurality of semiconductor devices 1 by the circle-shaped ceramic frames 10c; or a configuration of arranging the line-shaped ceramic frame 10d at the periphery of one semiconductor device 1.

According to the embodiments and its modified examples, it becomes possible to remarkably reduce the shear stress σzx applied to the bonded portion CP, also in the transfer-mold type power module 20 in which the difference between the CTE value of the metallic pattern 3 and the CTE value of the semiconductor device bonded on the metallic pattern 3 is relatively large. Accordingly, it becomes possible to suppress degradation, such as destruction, due to rupturing of the bonded portion CP during a heat cycle test, etc. and also becomes possible to maintain high electrical characteristics and high thermal characteristics, and thereby to obtain an improvement in reliability.

The power module according to the embodiments and its modified examples can be applied, in particular to various transfer-mold type power modules, e.g. IGBT modules in which IGBT chips are mounted on metallic (e.g. Cu) substrates, diode modules, MIS (Si, SiC, GaN) modules.

Moreover, there can be provided the low-cost power module having a simplified structure, easy to be fabricated through a simplified and easy process, and capable of improving mass productivity and realizing miniaturization thereof. In addition, the power module can be easily fabricated and excellent also in mass productivity.

Additional Embodiment 1

Figure 18:
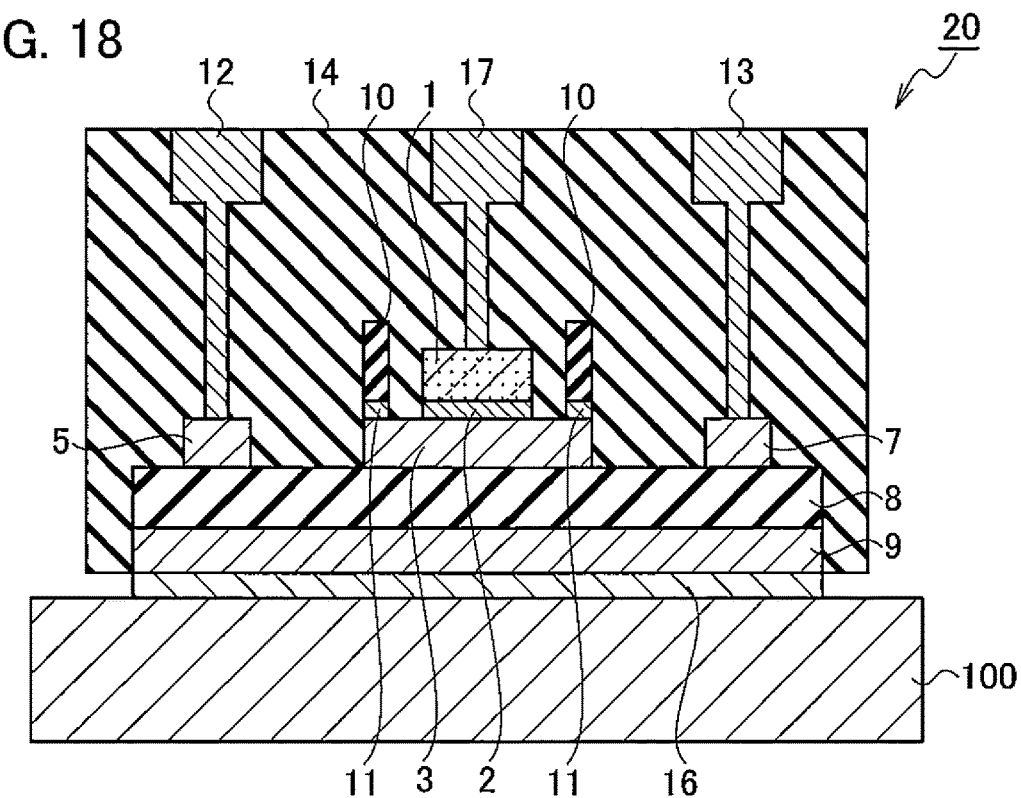
FIG. 18 is a schematic cross-sectional structure diagram showing a power module according to an additional embodiment 1.

As a power module 20 according to an additional embodiment 1, as shown in FIG. 18, a block terminal electrode 17 may be provided therein, instead of the bonding wires 4 and 6.

In this case, the block terminal electrode 17 can be disposed on a gate electrode or source electrode on the front side surface of the semiconductor device 1. Although one block terminal electrode 17 is illustrated in an example shown in FIG. 18, a plurality of the block terminal electrodes 17 may be disposed for the gate and source electrodes. Moreover, the block terminal electrode 17 may be formed by including Cu, CuMo, or the like.

Other configurations are the same as that of the above-mentioned present embodiments (e.g., refer to FIG. 14), it can be easily fabricated by connecting the block terminal electrode 17 on the gate electrode or source electrode on the front side surface of the semiconductor device 1 simultaneously with (or after or before) connecting the block terminal electrodes 12 and 13, instead of the wire bonding.

Additional Embodiment 2

Figure 19:
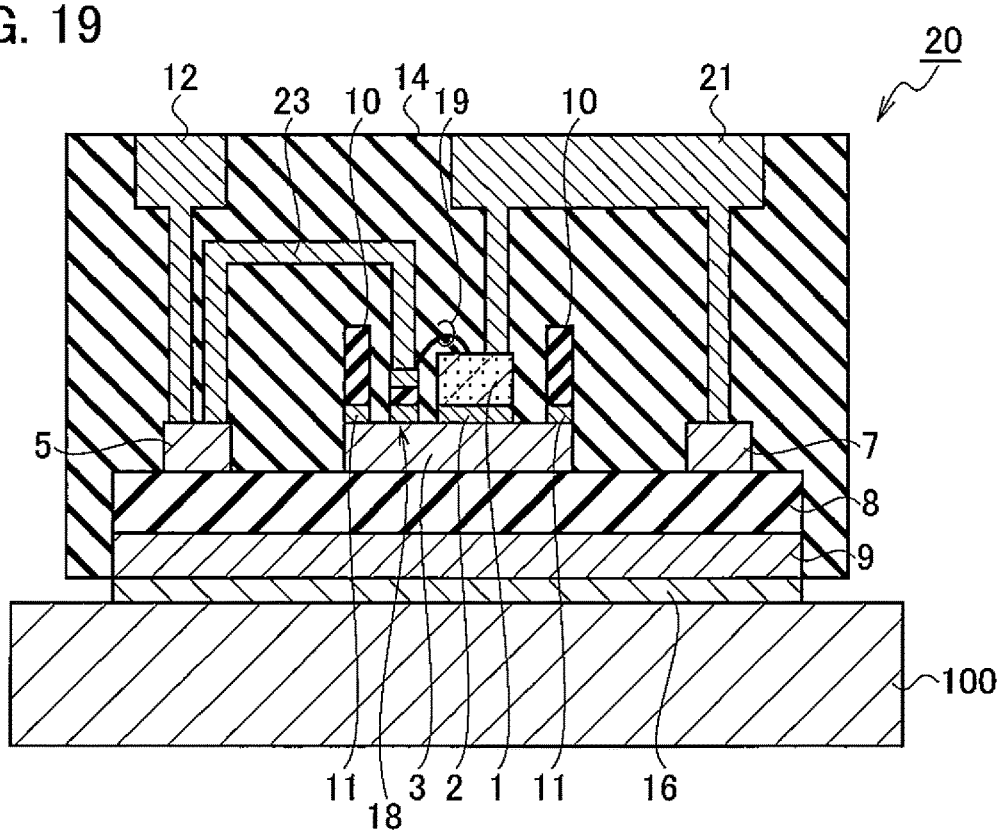
FIG. 19 is a schematic cross-sectional structure diagram showing a power module according to an additional embodiment 2.
Figure 20:
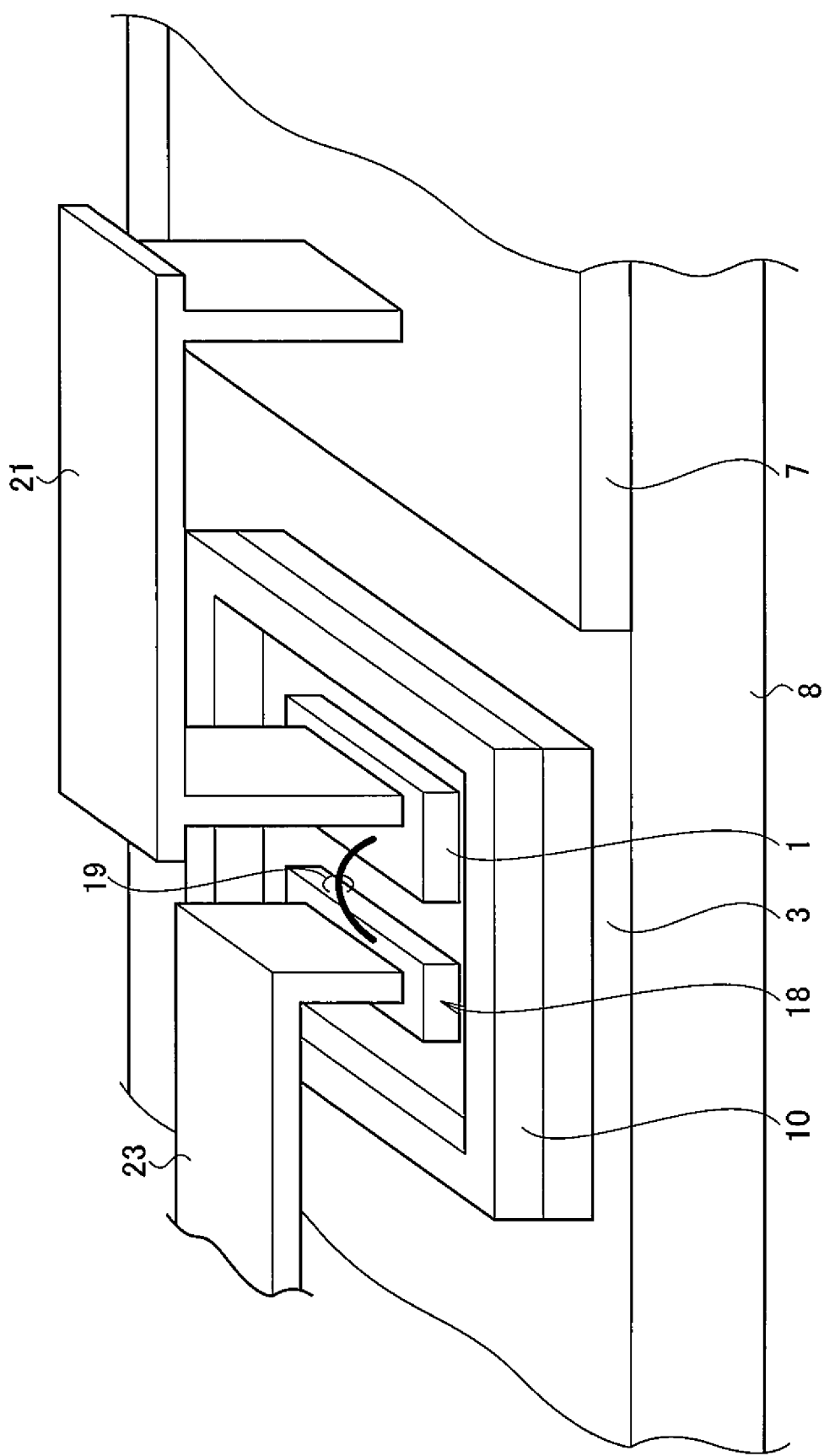
FIG. 20 is a bird's-eye view (perspective diagram) showing the power module according to the additional embodiment 2 such that a resin layer is in a transmitted state.

As shown in FIGS. 19 and 20, the power module 20 according to an additional embodiment 2 may include: a relaying substrate 18 configured to select a bonding wire 19 and a block terminal electrode 23, relaying substrate 18 disposed on the metallic pattern 3 inside the ceramic frame 10; and a block terminal electrode 21 configured to connect between a source electrode on the semiconductor device 1 and a metallic pattern 7 on the ceramics substrate 8.

FIG. 19 shows a schematic cross-sectional structure of the power module 20, and FIG. 20 shows a bird's-eye view configuration of the power module 20 such that the resin layer 14 is in a transmitted state.

In this case, the relaying substrate 18 includes a ceramics substrate, and copper foils (Cu frames) formed respectively on front side and back side surfaces of the ceramics substrate. More specifically, the relaying substrate 18 has a DBC substrate structure. Moreover, a DBA substrate or AMB substrate may be used as the relaying substrate 18.

The bonding wire 19 bonding-connects between the gate electrode on the semiconductor device 1 and the copper foil on the relaying substrate 18. The bonding wire 19 can be formed by including Al, AlCu, or the like, for example.

The block terminal electrode 23 is configured to connect between the copper foil on the relaying substrate 18 and the metallic pattern 5 on the ceramics substrate 8 respectively via soldering layers (not shown).

The block terminal electrodes 21 and 23 may be formed by including Cu, CuMo, or the like.

Other configurations are the same as that of the above-mentioned present embodiments (e.g., refer to FIG. 14), it can be easily fabricated by connecting the relaying substrate 18 is in the same manner as die bonding on the metallic pattern 3 inside the ceramic frame 10; bonding-connects the bonding wire 19 between the semiconductor device 1 and the relaying substrates 18 after bonding the semiconductor device 1 by die bonding; and respectively connecting the block terminal electrodes 21 and 23 between the semiconductor device 1 and the metallic pattern 7 and between the relaying substrate 18 and the metallic pattern 5 simultaneously with (or after or before) connecting the block terminal electrode 12 on the metallic pattern 5.

Additional Embodiment 3

Figure 21:
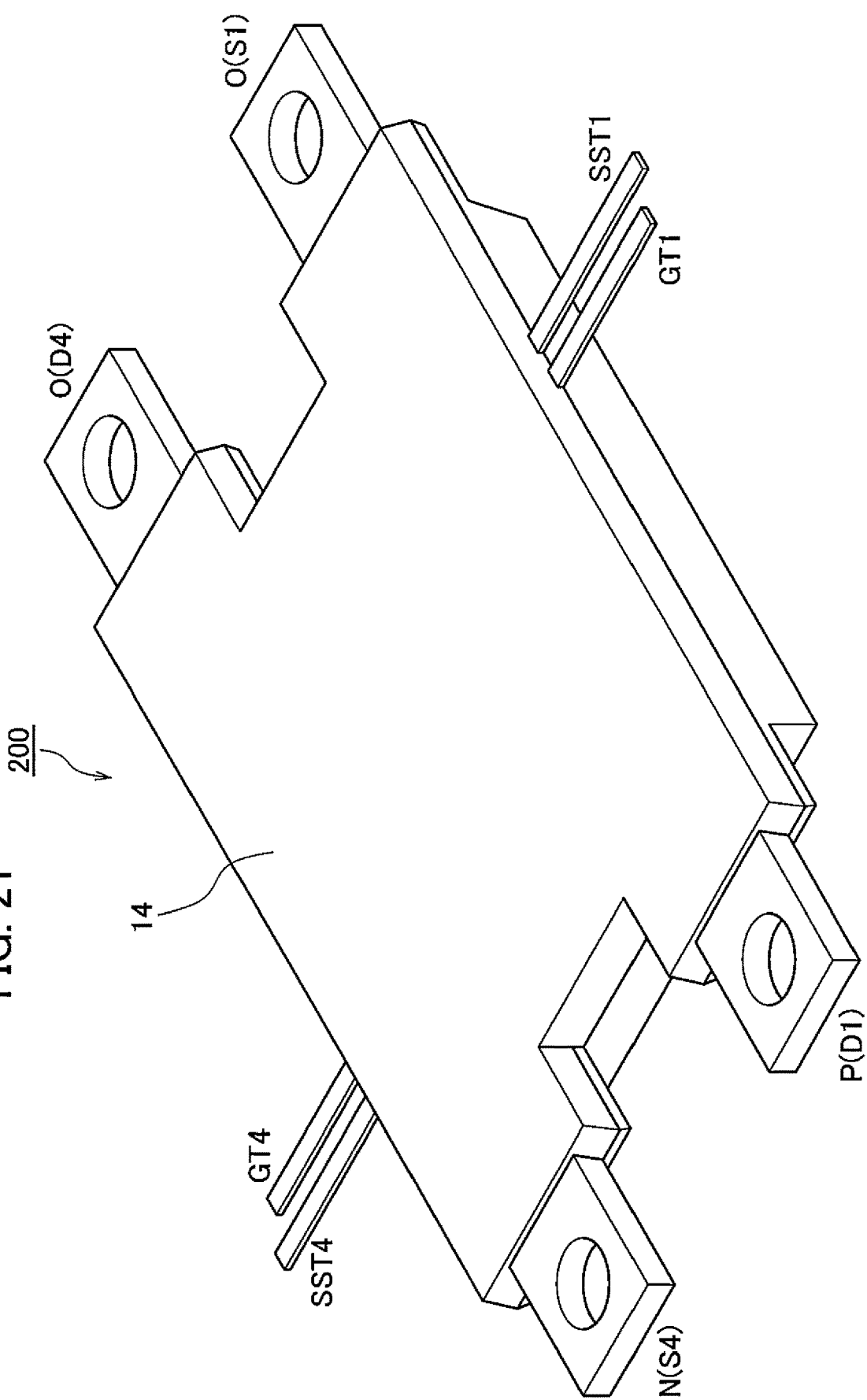
FIG. 21 is a bird's-eye view configuration diagram (perspective diagram) showing a module with the built-in half-bridge, in a power module according to an additional embodiment 3.

FIG. 21 shows a bird's-eye view configuration of so-called 2-in-1 module (module with the built-in half-bridge) in which two semiconductor devices are contained in one module, in a power module 200 according to an additional embodiment 3.

Figure 22:
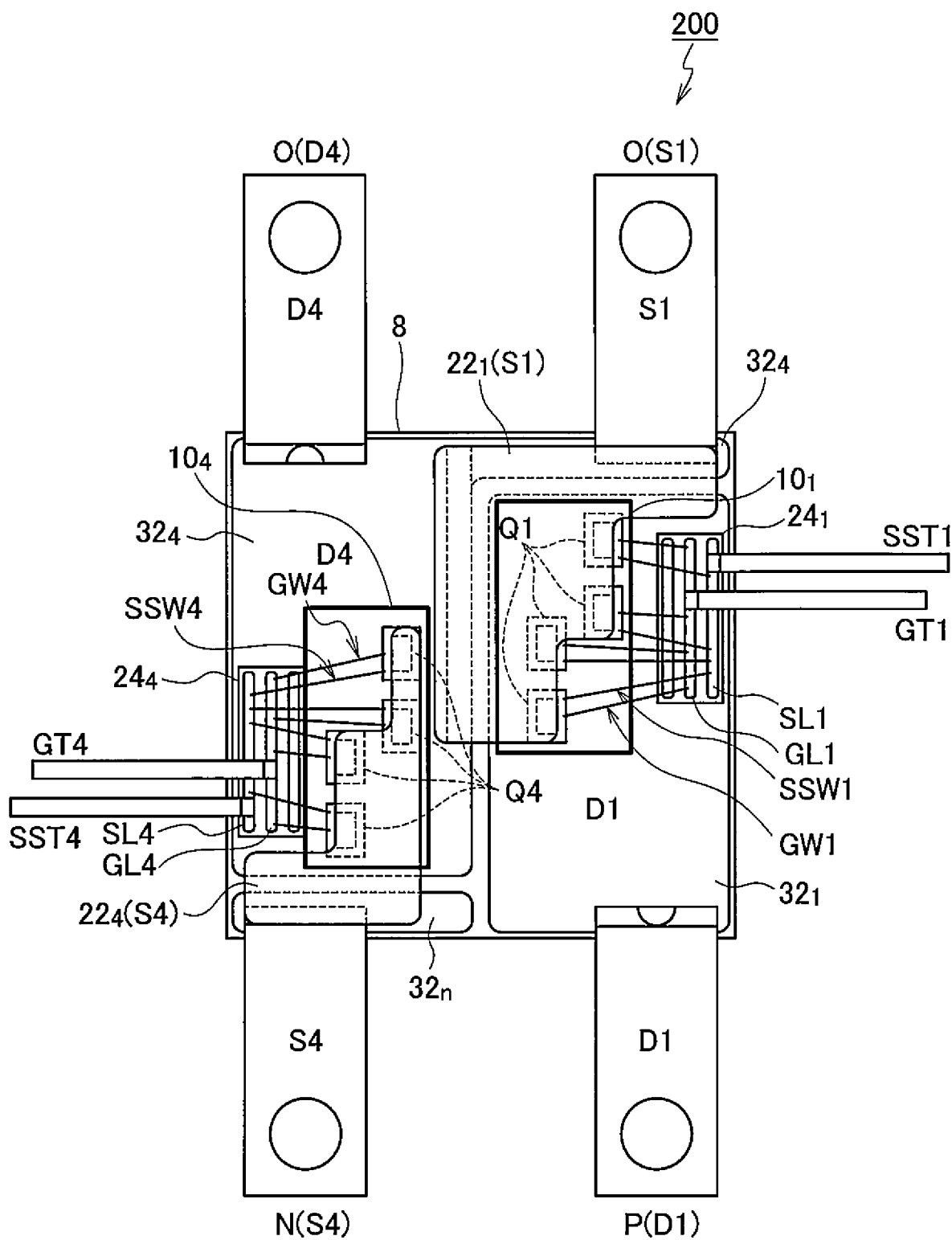
FIG. 22 is a planar pattern configuration diagram showing the power module according to the additional embodiment 3 such that a resin layer is in a transmitted state, in a 2-in-1 module (module with the built-in half-bridge).
Figure 23:
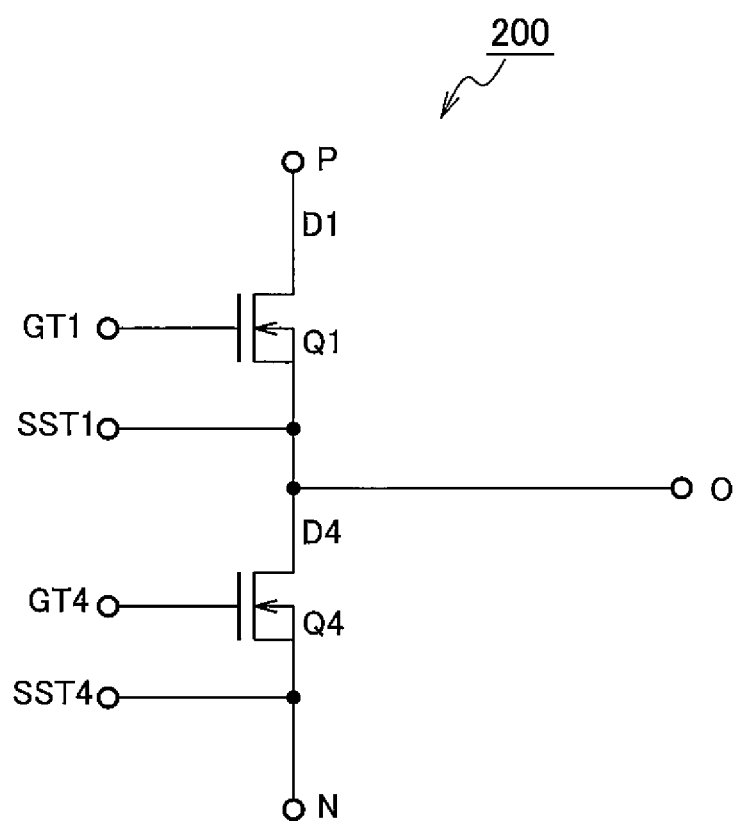
FIG. 23 is a circuit configuration diagram showing the 2-in-1 module (module with the built-in half-bridge) in which an SiC Metal Oxide Semiconductor Field Effect Transistor (MISFET) is applied as a semiconductor device, in the power module according to the additional embodiment 3.

Moreover, FIG. 22 shows a planar pattern configuration of the power module 200 before forming the resin layer 14, and FIG. 23 shows a circuit configuration of the 2-in-1 module to which SiC MISFETs Q1 and Q4 are applied as semiconductor devices.

More specifically, the power module 200 according to the additional embodiment 3 includes a configuration of a module with so-called built-in half-bridge in which two MISFETs Q1 and Q4 are built in one module.

FIG. 22 shows an example of 4-chip of the MISFETs Q1 and 4-chip of the MISFETs Q4 respectively disposed in parallel. For example, one MISFET can mount five transistors (chip) at the maximum. Note that it is also possible to mount a part of five pieces of the chips for the diode DI thereon.

In this case, although the module can be understood as one large transistor, one piece or a plurality of transistors (chips) may be contained therein. More specifically, although the modules include 1-in-1 module, 2-in-1 module, 4-in-1 module, 6-in-1 module, etc., for example, a module configured to vertically connect two transistors to be contained on the module is called 2-in-1 module, a module configured to wire 2 sets of 2-in-1 module to be contained on the module is called 4-in-1 module, and a module configured to wire all to be contained on the module is called 6-in-1 module.

As shown in FIG. 21, the power module 200 according to the additional embodiment 3 includes: a positive-side power terminal P (D1) and a negative-side power terminal N (S4) disposed at a first side of the ceramic substrate 8 covered with the resin layer 14; a gate terminal GT1 and a source sense terminal SST1 disposed at a second side adjacent to the first side; output terminals O (S1) and O (D1) disposed at a third side opposite to the first side; and a gate terminal GT4 and a source sense terminal SST4 disposed at a fourth side opposite to the second side.

Moreover, as shown in FIG. 22, the gate terminal GT1 and the source sense terminal SST1 are connected to the signal wiring pattern GL1 for gate and the signal wiring pattern SL1 for source in the MISFET Q1; and the gate terminal GT4 and the source sense terminal SST4 are connected to the signal wiring pattern GL4 for gate and the signal wiring pattern SL4 for source in the MISFET Q4.

As shown in FIG. 22, wires for gate GW1 and GW4 and wires for source sense SSW1 and SSW4 are respectively connected from the MISFETs Q1 and Q4 toward the gate signal wiring patterns GL1 and GL4 and the source sense signal wiring patterns SL1 and SL4 which are respectively disposed on the signal substrates $24_1$ and $24_4$. Moreover, gate terminals GT1 and GT4 and source sense terminals SST1 and SST4 for external extraction are respectively connected to the signal wiring patterns GL1 and GL4 for gate and the signal wiring patterns SL1 and SL4 for source sense by soldering etc.

As shown in FIG. 22, the signal substrates $24_1$ and $24_4$ are connected by soldering etc. on the ceramics substrate 8.

Figure 24:
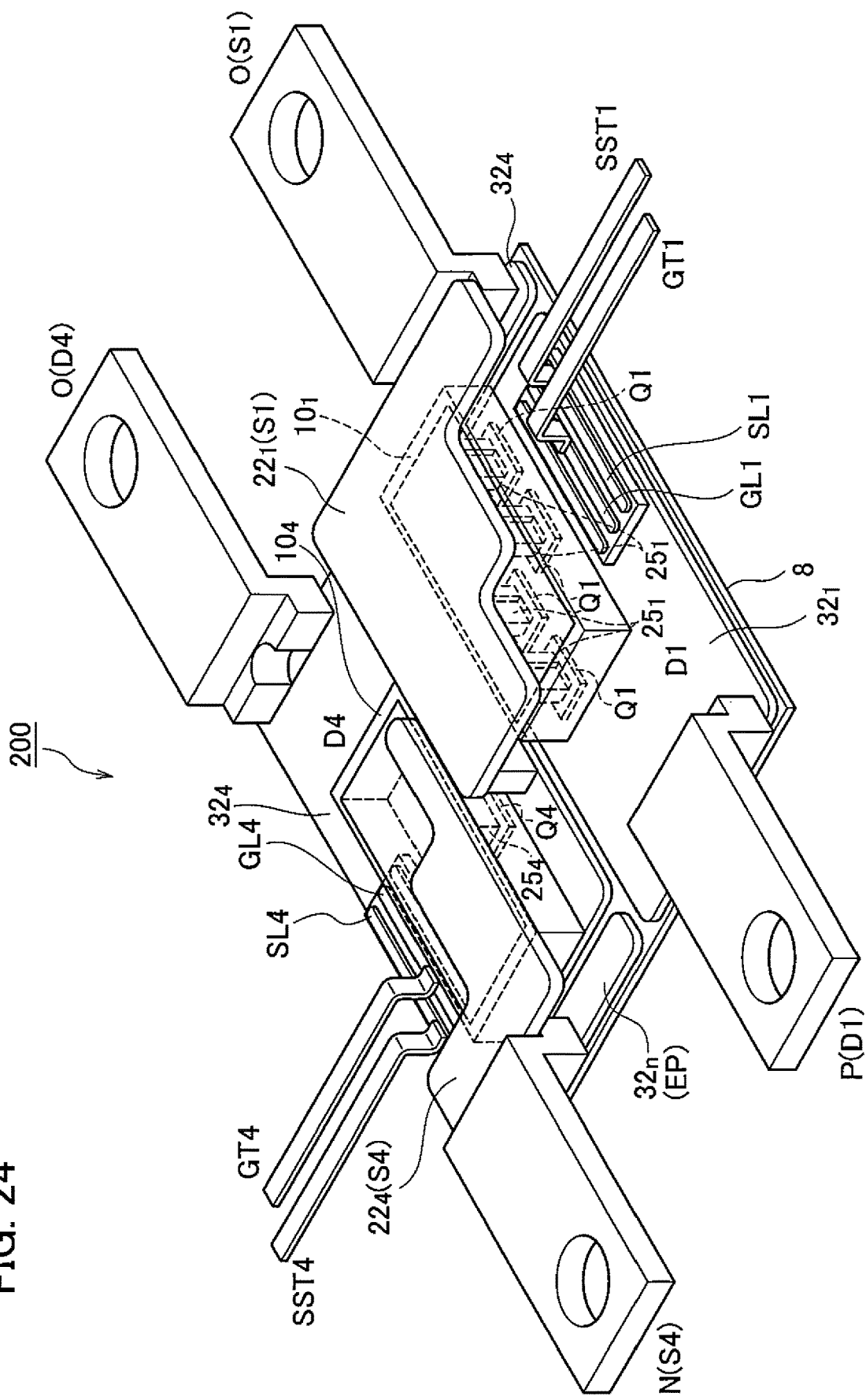
FIG. 24 is a bird's-eye view configuration diagram (perspective diagram) showing an aspect before forming the resin layer in the module with the built-in half-bridge, in the power module according to the additional embodiment 3.

FIG. 24 shows a bird's-eye view configuration before forming the resin layer 14 after forming upper surface plate electrodes $22_1$ and $22_4$, in the module with the built-in half-bridge, in the power module 200 according to the additional embodiment 3. Note that the wires GW1 and GW4 for gate and the wires SSW1 and SSW4 for source sense are not shown in FIG. 24.

The sources S1 and S4 of 4 chips of the MISFETs Q1 and Q4 respectively disposed in parallel are commonly connected with the upper surface plate electrodes $22_1$ and $22_4$.

Although illustration is omitted in FIGS. 21-24, diodes may be respectively connected reversely in parallel between a drain D1 and a source S1 and between a drain D4 and a source S4 of the MISFETs Q1 and Q4.

Although the sources S1 and S4 of 4 chips of the MISFETs Q1 and Q4 disposed in parallel are commonly connected with the upper surface plate electrodes $22_1$ and $22_4$ in an example shown in FIGS. 21-24, the sources may be conducted to one another with the wire instead of the upper surface plate electrodes $22_1$ and $22_4$.

The positive-side power terminal P and the negative-side power terminal N, and the gate terminals GT1 and GT4 and the source sense terminals SST1 and SST4 for external extraction can be formed of Cu, for example.

The signal substrates 241 and 244 can be formed by including a ceramics substrate. The ceramic substrate may be formed by including $Al_2O_3$, AlN, SiN, AlSiC, or SiC of which at least the surface is insulation, for example.

Main wiring conductors (metallic substrates) $32_1$, $32_4$, and $32_n$ (EP) used for electrode patterns can be formed by including Cu, Al, or the like, for example.

Portions of pillar electrodes $25_1$ and $25_4$ and upper surface plate electrodes $22_1$ and $22_4$ configured to respectively connect between the sources S1 and S4 of the MISFETs Q1 and Q4 and the upper surface plate electrodes $22_1$ and $22_4$ may be formed by including CuMo, Cu, or the like, for example.

The wires GW1 and GW4 for gate and the wires SSW1 and SSW4 for source sense can be formed by including Al, AlCu, or the like, for example.

Wide-bandgap type elements, such as SiC based power devices (e.g. SiC DIMISFET and SiC TMISFET), or GaN based power devices (e.g. GaN based FET, High Electron Mobility Transistor (HEMT)), can be applied as the MISFETs Q1 and Q4. In some instances, power devices, e.g. Si based MISFETs and IGBT, are also applicable thereto.

In the power module 200 according to the additional embodiment 3, 4 chips of the MISFETs Q1 are bonded via a bonding layer 2 under chip on the main wiring conductor $32_1$ in the ceramic frame $10_1$ disposed via a soldering layer etc. on the main wiring conductor $32_1$. Similarly, 4 chips of the MISFETs Q4 are bonded via a bonding layer 2 under chip on the main wiring conductor $32_4$ in the ceramic frame $10_4$ disposed via a soldering layer etc. on the main wiring conductor $32_4$.

The inside of each of the ceramic frames $10_1$ and $10_4$ is filled up with a resin, and each of the 4 chips of the MISFETs Q1 and Q4 is sealed with the resin. Moreover, the whole module is packaged by the resin layer 14 so as to include the upper surface plate electrodes $22_1$ and $22_4$, etc. The whole of the resin layer 14 is formed of a homogeneous material.

In addition, the respective ceramic frames $10_1$ and $10_4$ are configured to collectively contain the respective MISFETs Q1 and Q4, in the example shown in FIGS. 22 and 24, but the respective ceramic frames $10_1$ and $10_4$ may be configured to individually contain the respective MISFETs Q1 and Q4.

In the same manner as the embodiments, the principal portion of the power module 200 according to the additional embodiment 3 includes: a ceramics substrate 8; MISFETs Q1 and Q4 respectively bonded to main wiring conductors $32_1$ and $32_4$ on the ceramics substrate 8; ceramic frames $10_1$ and $10_4$ respectively disposed on the main wiring conductor $32_1$ and $32_4$, the ceramic frames $10_1$ and $10_4$ configured to enclose the MISFETs Q1 and Q4; and resin layers 14 configured to respectively seal the MISFETs Q1 and Q4 inside the ceramic frames $10_1$ and $10_4$, and to respectively seal the main wiring conductors $32_1$ and $32_4$ and the ceramics substrate 8 inside the ceramic frames $10_1$ and $10_4$.

Also in the power module 200 according to the additional embodiment 3, the same resin material as that of the embodiments and its modified examples 1-8 can be applied to the resin layer 14, and the same configuration of the ceramic frame 10 as that of the embodiments and its modified examples 1-8 can be adopted into the ceramic frames $10_1$ and $10_4$.

Also in the power module 200 according to the additional embodiment 3, the block terminal electrodes 12 and 13, the relaying substrate 18, etc. may be applied instead of the wires GW1 and GW4 for gate and the wires SSW1 and SSW4 for source sense, in order to prevent wire breaking due to a thermal stress etc. and to obtain an improvement in reliability.

Also in the power module 200 according to the additional embodiment 3, a simplification of the module fabrication process and a miniaturization of the module can be realized since the same fabrication method as that of the embodiments or other additional embodiments can be applied and therefore the module fabrication can be realized without attachment of a case. Also in the power module 200 according to the additional embodiment 3, since structural members, e.g. a case, are unnecessary, the number of parts is reduced, and thereby realizing cost reduction.

Thus, also according to the additional embodiment 3, it becomes possible to remarkably reduce the shear stress $\sigma zx$ applied to the bonded portion CP, also in the transfer-mold type power module 200 in which the difference between the CTE value of the main wiring conductors $32_1$ and $32_4$ and the CTE value of the MISFETs Q1 and Q4 bonded on the main wiring conductors $32_1$ and $32_4$ is relatively large. Accordingly, also in the transfer-mold type power module 200, it becomes possible to suppress degradation, such as destruction, due to rupturing of the bonded portion during a heat cycle test, etc. and also becomes possible to maintain high electrical characteristics and high thermal characteristics, and thereby to obtain an improvement in reliability.

Moreover, there can be provided the low-cost power module having a simplified structure, easy to be fabricated through a simplified and easy process, and capable of improving mass productivity and realizing miniaturization thereof. In addition, the power module can be easily fabricated and excellent also in mass productivity.

Examples of Power Module

Hereinafter, there will now be explained examples of the power module 20 according to the embodiments. Naturally, the configuration in which the ceramic frame 10 is formed in the periphery of the semiconductor device 1 on the metallic pattern 3 is adopted, in order to reduce the difference between the CTE value of the metallic pattern 3 and the CTE value of the semiconductor device 1 also in the power module 20 explained hereinafter.

Figure 25A:
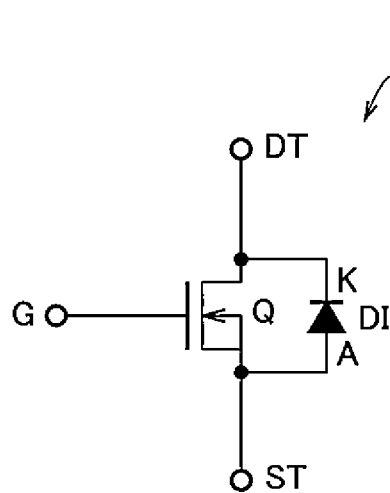
FIG. 25A is a circuit representative diagram of the SiC MISFET of a 1-in-1 module, which is the power module according to the embodiments.
Figure 25B:
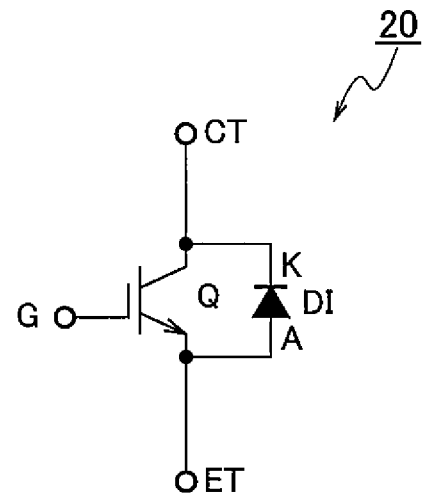

FIG. 25A shows a schematic circuit representative of an SiC MISFET of the 1-in-1 module, which is the power module 20 according to the embodiments. FIG. 25B shows a schematic circuit representation of the IGBT of the 1-in-1 module.

A diode DI connected in reversely parallel to the MISFET Q is shown in FIG. 25A. A main electrode of the MISFET Q is expressed with a drain terminal DT and a source terminal ST.

Similarly, a diode DI connected in reversely parallel to the IGBT Q is shown in FIG. 25B. A main electrode of the IGBT Q is expressed with a collector terminal CT and an emitter terminal ET.

Figure 26:
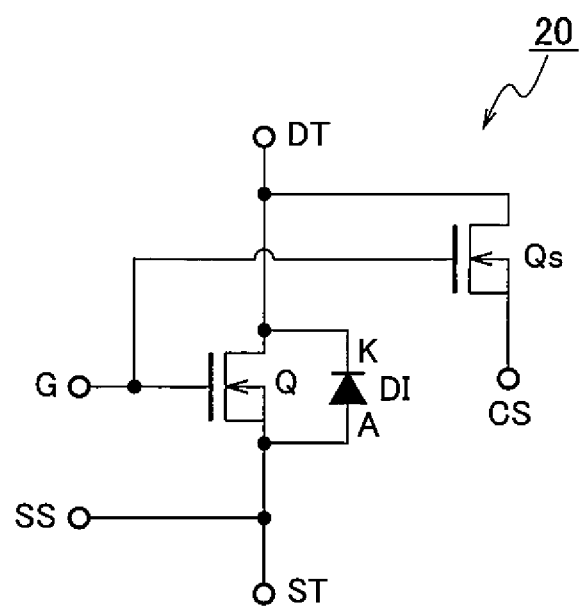
FIG. 26 is a detail circuit representative diagram of the SiC MISFET of the 1-in-1 module, which is the power module according to the embodiments.

Moreover, FIG. 26 shows a detailed circuit representative of the SiC MISFET of the 1-in-1 module, which is the power module 20 according to the embodiments.

The power module 20 according to the embodiments includes a configuration of 1-in-1 module, for example. More specifically, one MISFET is contained in one module, and a maximum of 5 chips (five transistors) connected in parallel to one another can be mounted in one MISFET, as an example. Note that it is also possible to mount a part of five pieces of the chips for the diode DI thereon.

More particularly, as shown in FIG. 26, a sense MISFET Qs is connected to the MISFET Q in parallel. The sense MISFET Qs is formed as a miniaturized transistor in the same chip as the MISFET Q. In FIG. 26, reference numeral SS denotes a source sense terminal, reference numeral CS denotes a current sense terminal, and reference numeral G denotes a gate signal terminal.

Note that, also in the semiconductor chip 1 according to the embodiments, the sense MISFET Qs is formed as a miniaturized transistor in the same chip.

Figure 27A:
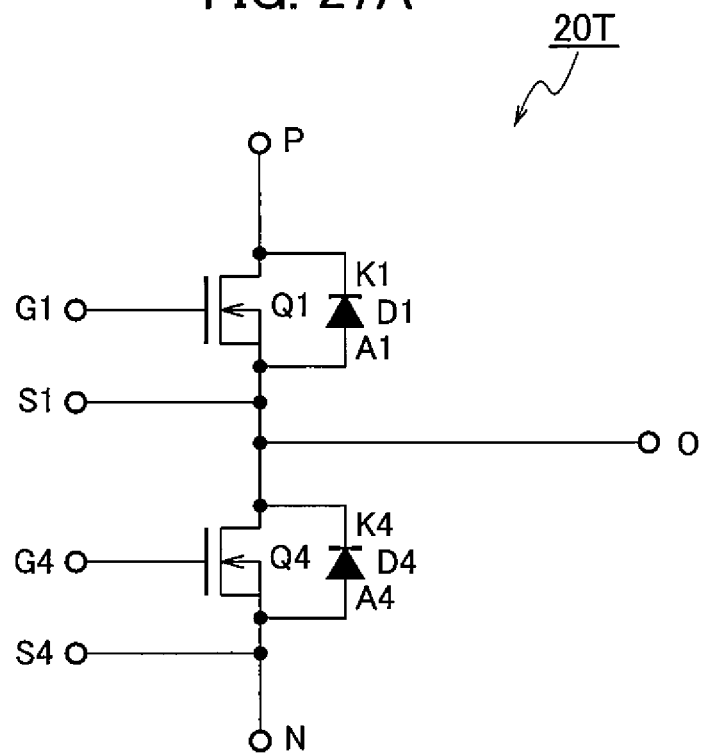
FIG. 27A is a circuit representative diagram of an SiC MISFET of a 2-in-1 module, which is the power module according to the embodiments.

Moreover, FIG. 27A shows a circuit representative of the SiC MISFET of the 1-in-1 module, which is the power module 20T according to the embodiments.

As shown in FIG. 27A, two MISFETs Q1 and Q4, and diodes D1 and D4 connected in reversely parallel to the MISFETs Q1 and Q4 are built in one module. In FIG. 27A, reference numeral G1 denotes a gate signal terminal of the MISFET Q1, and reference numeral S1 denotes a source terminal of the MISFET Q1. Reference numeral G4 denotes a gate signal terminal of the MISFET Q4, and reference numeral S4 denotes a source terminal of the MISFET Q4. Reference numeral P denotes a positive side power input terminal, reference numeral N denotes a negative side power input terminal, and reference numeral O denotes an output terminal.

Figure 27B:
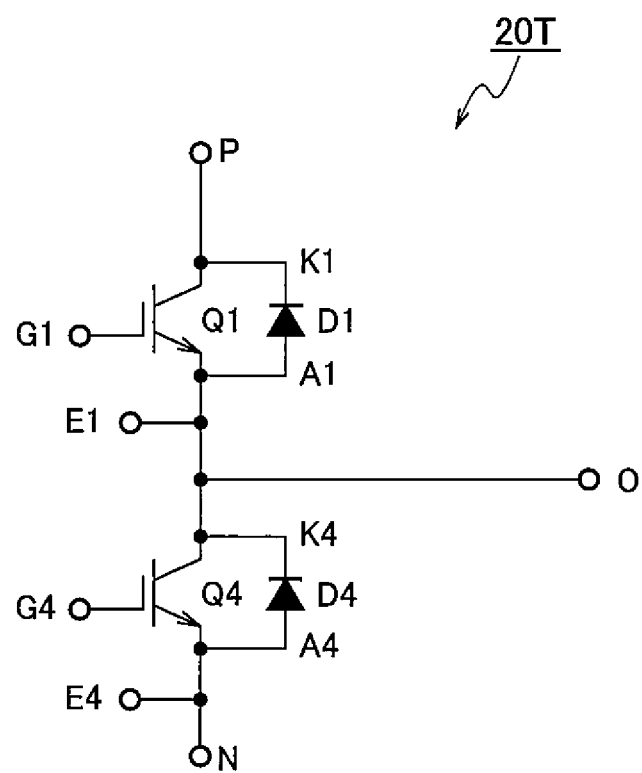
FIG. 27B is a circuit representative diagram of an IGBT of a 2-in-1 module, which is the power module according to the embodiments.

Moreover, FIG. 27B shows a circuit representative of the 2-in-1 module, which is the power module 20T according to the embodiments.

As shown in FIG. 27B, two IGBTs Q1 and Q4, and diodes D1 and D4 connected in reversely parallel to the IGBTs Q1 and Q4 are built in one module. In FIG. 27B, reference numeral G1 denotes a gate signal terminal of the IGBT Q1, and reference numeral µl denotes an emitter terminal of the IGBT Q1. Reference numeral G4 denotes a gate signal terminal of the IGBT Q4, and reference numeral E4 denotes an emitter terminal of the IGBT Q4. Reference numeral P denotes a positive side power input terminal, reference numeral N denotes a negative side power input terminal, and reference numeral O denotes an output terminal.

Configuration Example of Semiconductor Device

FIG. 28A shows a schematic cross-sectional structure of an SiC MISFET 110, which is an example of a semiconductor device which can be applied to the power modules 20 and 20T according to the embodiments, and FIG. 28B shows a schematic cross-sectional structure of the IGBT 110A.

As shown in FIG. 28A, the schematic cross-sectional structure of the SiC MISFET 110 includes: a semiconductor substrate 126 composed by including an n⁻ type high resistivity layer; a p body region 128 formed on a front surface side of the semiconductor substrate 126; a source region 130 formed on a front side surface of the p body region 128; a gate insulating film 132 disposed on a front side surface of the semiconductor substrate 126 between the p body regions 128; a gate electrode 138 disposed on the gate insulating film 132; a source electrode 134 connected to the source region 130 and the p body region 128; an n⁺ drain region 124 disposed on a back side surface opposite to the surface of the semiconductor substrate 126; and a drain electrode 136 connected to the n⁺ type drain area 124.

Although the planar-gate-type n channel vertical SiC-MISFET is disclosed in FIG. 28A, the semiconductor device may be composed by including a trench-gate-type n channel vertical SiC-TMISFET, etc., shown in FIG. 32 mentioned below. Moreover, a GaN based FET etc. can also be adopted thereinto, instead of the SiC MISFET. It is especially effective to adopt any one of an SiC-based or GaN-based power device, as the power modules 20 and 20T according to the embodiments.

Furthermore, a wide-bandgap type semiconductor of which the bandgap energy is from 1.1 eV to 8 eV, for example, can be used for the semiconductor device applicable to the power modules 20 and 20T according to the embodiments.

Similarly, as shown in FIG. 28B, IGBT 110A as an example of the semiconductor device applicable to the power modules 20 and 20T according to the embodiments includes: a semiconductor substrate 126 composed by including an n⁻ type high resistivity layer; a p body region 128 formed on a front surface side of the semiconductor substrate 126; an emitter region 130E formed on a front side surface of the p body region 128; a gate insulating film 132 disposed on a front side surface of the semiconductor substrate 126 between the p body regions 128; a gate electrode 138 disposed on the gate insulating film 132; an emitter electrode 134E connected to the emitter region 130E and the p body region 128; a p⁺ collector region 124P disposed on a back side surface opposite to the surface of the semiconductor substrate 126; and a collector electrode 136 connected to the p⁺ collector region 124P.

In the example shown in FIG. 28B, although the semiconductor device 110 composed by including the planar-gate-type n channel vertical IGBT is disclosed, the semiconductor device may be composed by including a trench-gate-type n channel vertical IGBT, etc.

FIG. 29 shows a schematic cross-sectional structure of an SiC MISFET 110 including a source pad electrode SP and a gate pad electrode GP, which is an example of the semiconductor device applicable to the power modules 20 and 20T according to the embodiments.

In FIG. 29, the gate pad electrode GP is connected to the gate electrode 138 disposed on the gate insulating film 132, and the source pad electrode SP is connected to the source electrode 134 connected to the source region 130 and the p body region 128. Moreover, as shown in FIG. 29, the gate pad electrode GP and the source pad electrode SP are disposed on an interlayer insulating film 144 for passivation which covers the surface thereof.

In addition, microstructural transistor structure may be formed in the semiconductor substrate 126 below the gate pad electrode GP and the source pad electrode SP in the same manner as the center portion shown in FIG. 28A or 29.

Furthermore, as shown in FIG. 29, the source pad electrode SP may be disposed to be extended onto the interlayer insulating film 144 for passivation, also in the transistor structure of the center portion.

FIG. 30 shows a schematic cross-sectional structure of an IGBT 110A including a source pad electrode SP and a gate pad electrode GP, which is an example of the semiconductor device applied to the power modules 20 and 20T according to the embodiments.

In FIG. 30, the gate pad electrode GP is connected to the gate electrode 138 disposed on the gate insulating film 132, and the emitter pad electrode EP is connected to the emitter electrode 134E connected to the emitter region 130E and the p body region 128. Moreover, as shown in FIG. 30, the gate pad electrode GP and the emitter pad electrode EP are disposed on an interlayer insulating film 144 for passivation which covers the surface thereof.

In addition, microstructural IGBT structure may be formed in the semiconductor substrate 126 below the gate pad electrode GP and the emitter pad electrode EP in the same manner as the center portion shown in FIG. 28B or 30.

Furthermore, as shown in FIG. 30, the emitter pad electrode EP may be disposed to be extended onto the interlayer insulating film 144 for passivation, also in the IGBT structure of the center portion.

-SiC DIMISFET-

Figure 31:
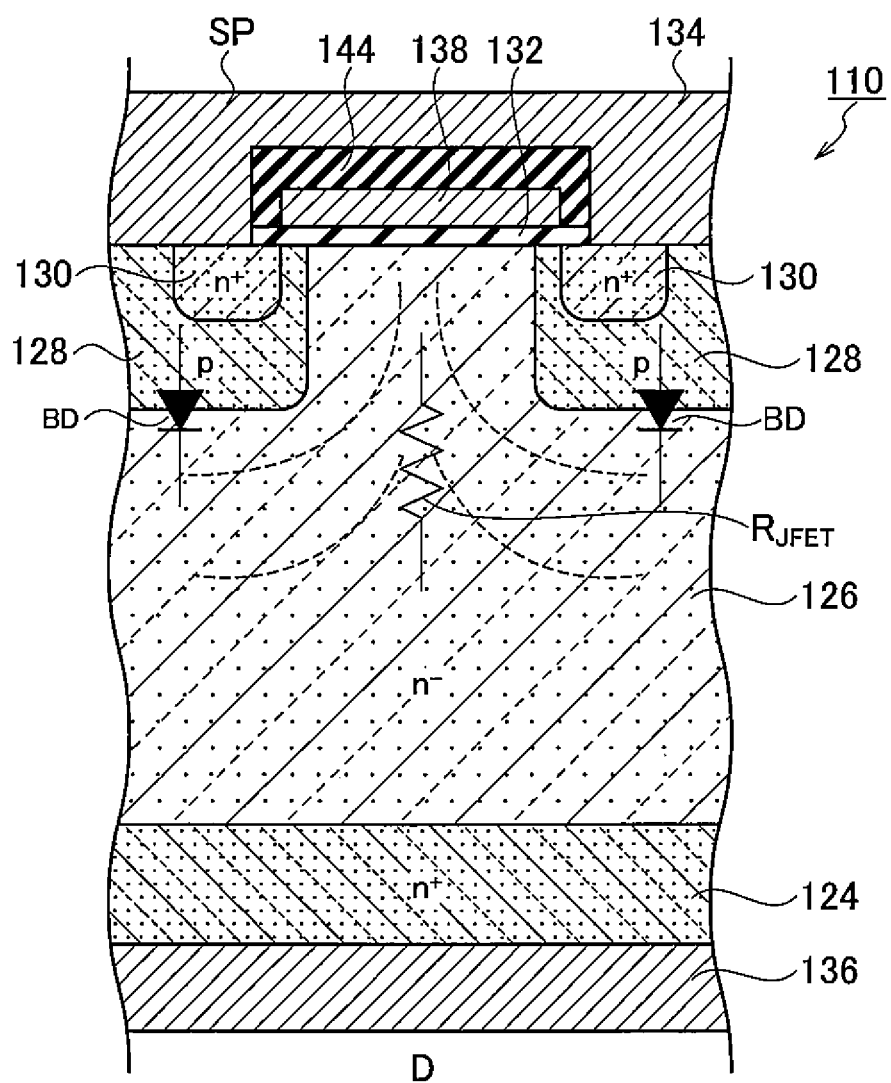
FIG. 31 is a schematic cross-sectional structure diagram of an SiC Double Implanted MISFET (SiC DIMISFET), which is an example of a semiconductor device which can be applied to the power module according to the embodiments.

FIG. 31 shows a schematic cross-sectional structure of an SiC DIMISFET 110, which is an example of a semiconductor device which can be applied to the power module 20T according to the embodiments.

As shown in FIG. 31, the SiC DIMISFET applicable to the power module 20T according to the embodiments includes: a semiconductor substrate 126 composed by including an n⁻ type high resistivity layer; a p body region 128 formed on a front surface side of the semiconductor substrate 126; an n⁺ source region 130 formed on a front side surface of the p body region 128; a gate insulating film 132 disposed on a front side surface of the semiconductor substrate 126 between the p body regions 128; a gate electrode 138 disposed on the gate insulating film 132; a source electrode 134 connected to the source region 130 and the p body region 128; an n⁺ drain region 124 disposed on a back side surface opposite to the surface of the semiconductor substrate 126; and a drain electrode 136 connected to the n⁺ type drain area 124.

In FIG. 31, the p body region 128 and the n⁺ source region 130 formed on the front side surface of the p body region 128 are formed with double ion implantation (DI), and the source pad electrode SP is connected to the source region 130 and the source electrode 134 connected to the p body region 128. Moreover, a gate pad electrode GP (not shown) is connected to the gate electrode 138 disposed on the gate insulating film 132. Moreover, as shown in FIG. 31, the source pad electrode SP and the gate pad electrode GP (not shown) are disposed on an interlayer insulating film 144 for passivation configured to cover the front side surface thereof.

As shown in FIG. 31, in the SiC DIMISFET 110, since a depletion layer as shown with the dashed lines is formed in the semiconductor substrate 126 composed of a n⁻ type high resistivity layer inserted into the p body regions 128, channel resistance $RJ_{FET}$ accompanying the junction type FET (JFET) effect is formed. Moreover, as shown in FIG. 31, body diodes BD are respectively formed between the p body regions 128 and the semiconductor substrates 126.

-SiC TMISFET-

Figure 32:
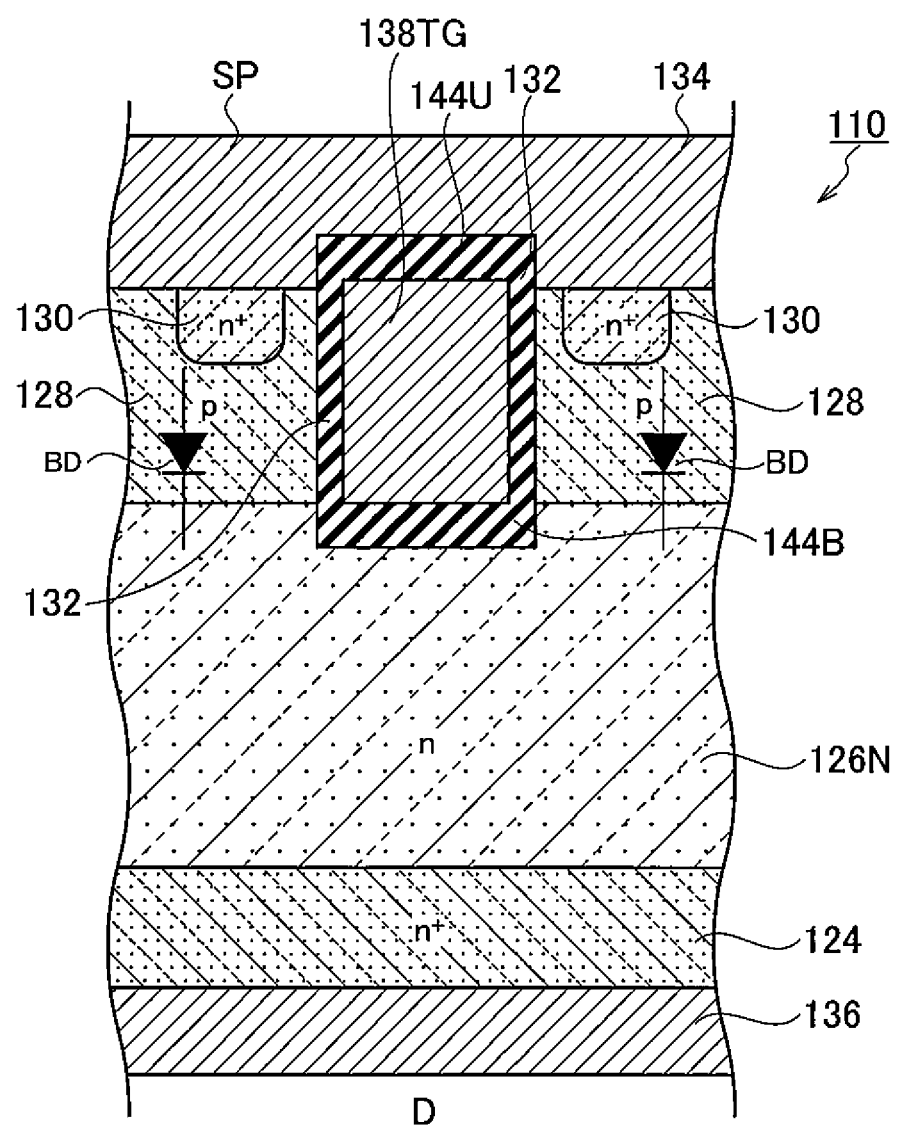
FIG. 32 is a schematic cross-sectional structure diagram of an SiC Trench MISFET (SiC TMISFET), which is an example of a semiconductor device which can be applied to the power module according to the embodiments.

FIG. 32 shows a schematic cross-sectional structure of an SiC TMISFET 110, which is an example of a semiconductor device which can be applied to the power module 20T according to the embodiments.

As shown in FIG. 32, the SiC TMISFET applicable to the power circuit 20T according to the embodiments includes: a semiconductor substrate 126N composed by including an n layer; a p body region 128 formed on a front surface side of the semiconductor substrate 126N; an n⁺ source region 130 formed on a front side surface of the p body region 128; a trench gate electrode 138TG passing through the p body region 128, the trench gate electrode 138TG formed in the trench formed up to the semiconductor substrate 126N via the gate insulating layer 132 and the interlayer insulating films 144U and 144B; a source electrode 134 connected to the source region 130 and the p body region 128; an n⁺ type drain area 124 disposed on a back side surface of the semiconductor substrate 126N opposite to the front side surface thereof; and a drain electrode 136 connected to the n⁺ type drain area 124.

In FIG. 32, a trench gate electrode 138TG passing through the p body region 128 is formed in the trench formed up to the semiconductor substrate 126N via the gate insulating layer 132 and the interlayer insulating films 144U and 144B; and the source pad electrode SP is connected to the source region 130 and the source electrode 134 connected to the p body region 128. A gate pad electrode GP (not shown) is connected to the gate electrode 138 disposed on the gate insulating film 132. Moreover, as shown in FIG. 32, the source pad electrode SP and the gate pad electrode GP (not shown) are disposed on an interlayer insulating film 144U for passivation configured to cover the front side surface thereof.

In the SiC TMISFET, channel resistance $RJ_{FET}$ accompanying the junction type FET (JFET) effect as the SiC DIMISFET is not formed. Moreover, body diodes BD are respectively formed between the p body regions 128 and the semiconductor substrates 126N, in the same manner as FIG. 31.

(Application Examples for Applying Power Module)

Figure 33A:
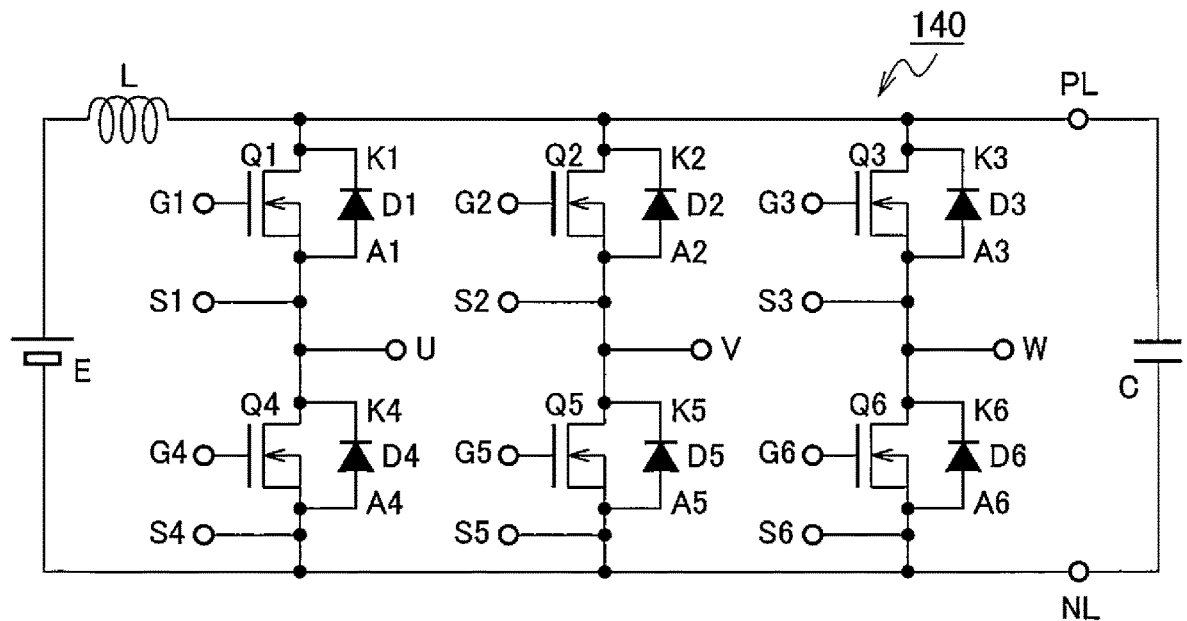
FIG. 33A shows an example of a circuit configuration in which the SiC MISFET is applied as a semiconductor device, and a snubber capacitor is connected between a power terminal PL and an earth terminal (ground terminal) NL, in a circuit configuration of a three-phase alternating current (AC) inverter composed using the power module according to the embodiments.

FIG. 33A shows an example of a circuit configuration in which the SiC MISFET is applied as a semiconductor device, and a snubber capacitor C is connected between the power terminal PL and the earth terminal (ground terminal) NL, in a circuit configuration of a three-phase AC inverter 140 composed using the power module 20T according to the embodiments.

Figure 33B:
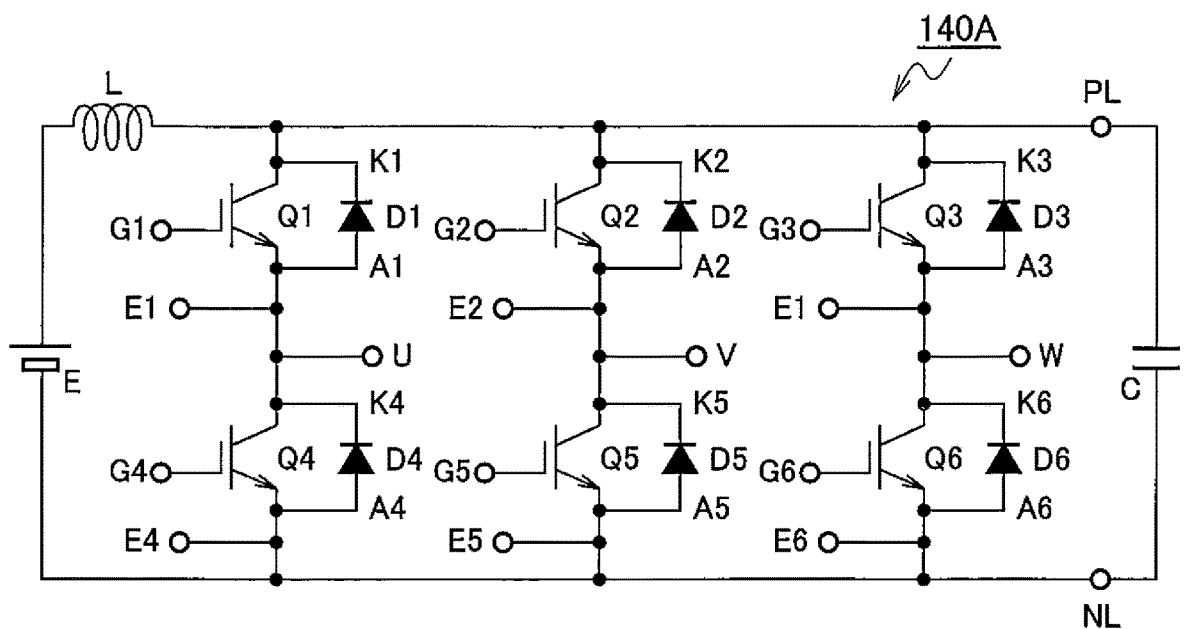
FIG. 33B shows an example of a circuit configuration in which the IGBT is applied as a semiconductor device, and the snubber capacitor is connected between the power terminal PL and the earth terminal (ground terminal) NL, in the circuit configuration of a three-phase AC inverter composed using the power module according to the embodiments.

Similarly, FIG. 33B shows an example of a circuit configuration in which the IGBT is applied as a semiconductor device, and a snubber capacitor C is connected between the power terminal PL and the earth terminal (ground terminal) NL, in a circuit configuration of a three-phase AC inverter 140A composed using the power module 20T according to the embodiments.

When connecting the power module 20T according to the embodiments to the power source E, large surge voltage Ldi/dt is produced by an inductance L included in a connection line due to a high switching speed of the SiC MISFET and IGBT. For example, the surge voltage Ldi/dt is expressed as follows: $Ldi/dt = 3 \times 10^9$ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed by the snubber capacitor C connected between the power terminal PL and the earth terminal (ground terminal) NL.

(Concrete Examples for Applying Power Module)

Next, there will now be explained the three-phase AC inverter 140 composed using the power module 20T according to the embodiments to which the SiC MISFET is applied as the semiconductor device, with reference to FIG. 34.

Figure 34:
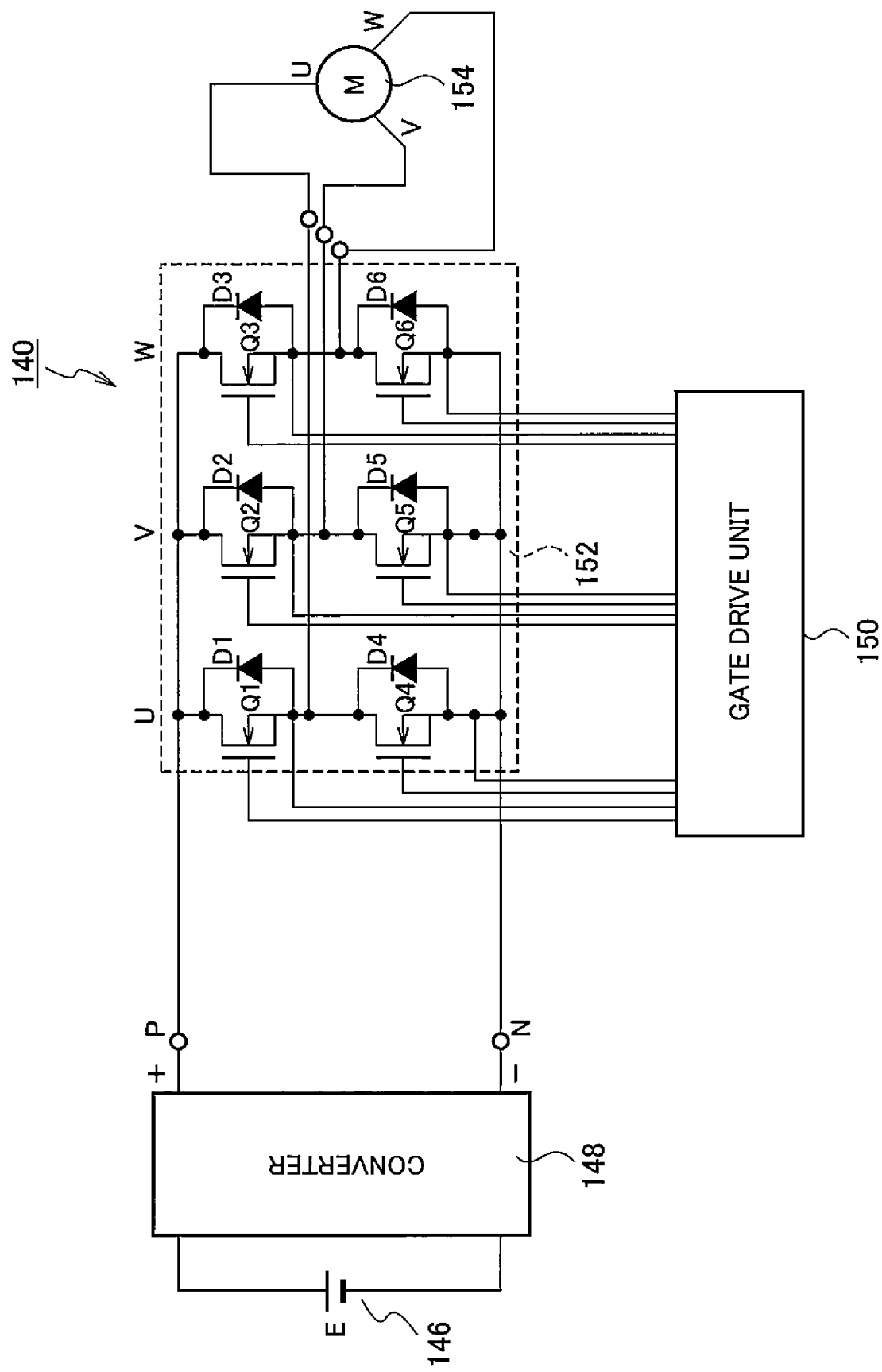
FIG. 34 is a circuit configuration diagram of a three-phase AC inverter composed using the power module according to the embodiments to which the SiC MISFET is applied as the semiconductor device.

As shown in FIG. 34, the three-phase AC inverter 140 includes a gate drive unit 150, a power module unit 152 connected to the gate drive unit 150, and a three-phase AC motor unit 154. U-phase, V-phase, and W-phase inverters are respectively connected to the three-phase AC motor unit 54 so as to correspond to U phase, V phase, and W phase of the three-phase AC motor unit 154, in the power module unit 152.

In this case, the gate drive unit 150 is connected to the SiC MISFETs Q1 and Q4, SiC MISFETs Q2 and Q5, and the SiC MISFETs Q3 and Q6.

The power module unit 152 includes the SiC MISFETs (Q1 and Q4), (Q2 and Q5), and (Q3 and Q6) having inverter configurations connected between a positive terminal (+) and a negative terminal (−) to which the converter 148 in a power supply or a storage battery (E) 146 is connected. Moreover, flywheel diodes D1-D6 are respectively connected reversely in parallel between the source and the drain of the SiC MISFETs Q1-Q6.

Next, there will now be explained the three-phase AC inverter 140A composed using the power module 20T according to the embodiments to which the IGBT is applied as the semiconductor device, with reference to FIG. 35.

Figure 35:
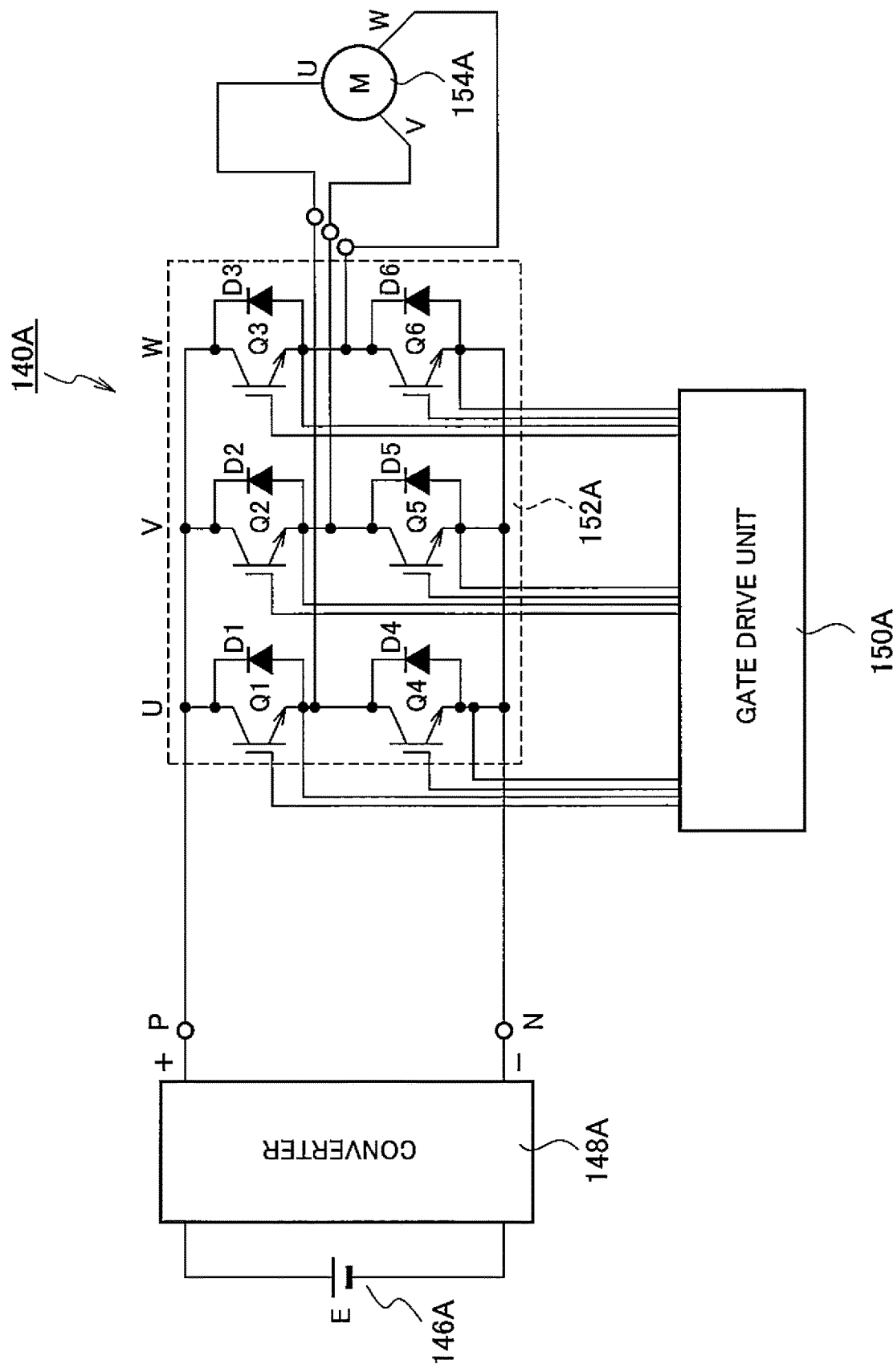
FIG. 35 is a circuit configuration diagram of a three-phase AC inverter composed using the power module according to the embodiments to which the IGBT is applied as the semiconductor device.

As shown in FIG. 35, the three-phase AC inverter 140A includes a gate drive unit 150A, a power module unit 152A connected to the gate drive unit 150A, and a three-phase AC motor unit 154A. U-phase, V-phase, and W-phase inverters are respectively connected to the three-phase AC motor unit 152A so as to correspond to U phase, V phase, and W phase of the three-phase AC motor unit 154A, in the power module unit 152A.

In this case, the gate drive unit 150A is connected to the IGBTs Q1 and Q4, IGBTs Q2 and Q5, and the IGBTs Q3 and Q6.

The power module unit 152A includes the IGBTs (Q1 and Q4), (Q2 and Q5), and (Q3 and Q6) having inverter configurations connected between a positive terminal (+) and a negative terminal (−) to which the converter 148A in a storage battery (E) 146A is connected. Moreover, flywheel diodes D1-D6 are respectively connected reversely in parallel between the emitter and the collector of the IGBTs Q1-Q6.

The power module 20T according to the embodiments can be formed as any one selected from the group consist of 1-in-1 module, 2-in-1 module, 4-in-1 module, 6-in-1 module, and 7-in-1 module.

As explained above, according to the embodiments, there can be provided: the power module easy to be fabricated, capable of suppressing the degradation of the bonded portion and improving reliability; and the inverter equipment on which such a power module is mounted, also when adopting the transfer-mold type power module.

OTHER EMBODIMENTS

As explained above, the embodiments have been described, as a disclosure including associated description and drawings to be construed as illustrative, not restrictive.

This disclosure makes clear a variety of alternative embodiments, working examples, and operational techniques for those skilled in the art.

Such being the case, the embodiments cover a variety of embodiments and the like, whether described or not.

INDUSTRIAL APPLICABILITY

The power module according to the embodiments can be used for manufacturing techniques for power modules, e.g. IGBT modules, diode modules, MIS modules (Si, SiC, GaN), and the like, and can be applied to wide applicable fields, e.g. inverters for HEV/EV, inverter and converters for industrial applications, etc.

What is claimed is:

1. A power module comprising:
    a metallic substrate formed by forming a first metallic pattern on a surface of a mounting substrate;
    a plurality of power devices configured to be bonded on the metallic substrate;
    a frame member disposed so as to collectively enclose the plurality of the power devices on the metallic substrate; and
    a resin layer configured to seal the plurality of the power devices and a side surface of the metallic substrate so as to include the frame member, wherein
    a coefficient of thermal expansion of the frame member is a coefficient of thermal expansion for suppressing a stress according to a difference between a coefficient of thermal expansion of the first metallic pattern and a coefficient of thermal expansion of the power devices, and a coefficient of thermal expansion of the resin layer is larger than the coefficient of thermal expansion of the frame member.

2. The power module according to claim 1, wherein the coefficient of thermal expansion of the frame member is smaller than the coefficient of thermal expansion of the first metallic pattern.

3. The power module according to claim 1, wherein the metallic substrate is a DBC substrate or a ceramics substrate, the ceramics substrate having a copper frame.

4. The power module according to claim 3, wherein the frame member is ceramic, a metal, or a composite material of the ceramic and the metal, and a coefficient of thermal expansion of the metal being lower than a coefficient of thermal expansion of the copper frame.

5. The power module according to claim 1, wherein when a value of the coefficient of thermal expansion of the first metallic pattern is 16 ppm/K and a value of the coefficient of thermal expansion of the power device is 3 ppm/K, the frame member has a value of a coefficient of thermal expansion within a range of 2 ppm/K to 10 ppm/K.

6. The power module according to claim 1, wherein the frame member is disposed along an edge of the metallic substrate.

7. The power module according to claim 1, wherein the frame member is disposed at an inner side than an edge of the metallic substrate.

8. The power module according to claim 1, wherein a planar view shape of the frame members is a shape of a plurality of lines in parallel so as to sandwich the power device.

9. The power module according to claim 1, wherein a surface roughening process is applied to a front side surface of the frame member.

10. The power module according to claim 1, wherein a material of the resin layer of a portion surrounded by the frame member is different from a material of the resin layer of a portion outside the frame member.

11. The power module according to claim 1, wherein a thickness of the frame member is thicker than the thickness of the power device.

12. The power module according to claim 1, further comprising:
a second metallic pattern formed on a back side surface of the mounting substrate; and
a block terminal electrode, one end of the block terminal electrode being connected to an electrode of the power device, and the other end of the block terminal electrode being connected to the second metallic pattern so as to get over the frame member.

13. The power module according to claim 1, further comprising:
a bonding wire connected to the power device; and a block terminal electrode.

14. The power module according to claim 1, wherein the wiring patterns are respectively formed on both surfaces of the mounting substrate of the metallic substrate.

15. The power module according to claim 14, further comprising
a heat sink, wherein
a back side surface of the metallic substrate is disposed on the heat sink.

16. The power module according to claim 15, wherein the mounting substrate further comprises a metallic frame, the metallic frame disposed on the back side surface of the mounting substrate, and
the metallic frame is connected to the heat sink.

17. The power module according to claim 14, wherein the resin layer is formed by transfer molding.

18. The power module according to claim 1, wherein a value of a coefficient of thermal expansion of the resin layer is within a range of 12 ppm/K to 14 ppm/K.

19. The power module according to claim 1, wherein the power device comprises one semiconductor chip selected from the group consisting of semiconductor chips of IGBT, diode, Si based MISFET, SiC based MISFET, and GaNFET.

20. The power module according to claim 1, wherein the metallic frame is one substrate selected from the group consisting of a DBA substrate and an AMB substrate.

21. The power module according to claim 1, wherein a cross-sectional structure of the frame member has one structure selected from the group consisting of an I-shaped structure, a T-shaped structure, an inverted-L-shaped structure, and Γ-shaped structure.

22. Inverter equipment comprising
a circuit in which a plurality of switching elements are connected in series and parallel between power terminals and a connection unit of the plurality of the switching elements is used as an output, wherein
the inverter equipment is configured to mount at least one or more pieces of the power modules according to claim 1, wherein
the frame member is disposed so as to collectively enclose the plurality of the power devices on the switching elements.

23. The inverter equipment according to claim 22, wherein
the plurality of the switching elements have external terminals respectively connected to pillar electrodes bonded to respective upper surfaces thereof via an upper surface plate electrode configured to commonly connect the pillar electrodes predetermined.

24. The power module according to claim 11, wherein a thickness of the frame member is substantially equal to a thickness of the metallic pattern.

* * * * *